US011706896B2

(12) United States Patent
Krivonak et al.

(10) Patent No.: US 11,706,896 B2
(45) Date of Patent: Jul. 18, 2023

(54) MODULAR RACK SYSTEM AND METHOD

(71) Applicant: Transportation IP Holdings, LLC, Norwalk, CT (US)

(72) Inventors: Andrew Louis Krivonak, Erie, PA (US); Jason Kuttenkuler, Erie, PA (US); Henry Todd Young, Erie, PA (US); Mark Murphy, Erie, PA (US); Ihar Tsimashevich, Erie, PA (US); Nicole Lyann Himmelwright, Erie, PA (US); Jeffrey John Wolff, Erie, PA (US)

(73) Assignee: TRANSPORTATION IP HOLDINGS, LLC, Norwalk, CT (US)

( * ) Notice: Subject to any disclaimer, the term of this patent is extended or adjusted under 35 U.S.C. 154(b) by 393 days.

(21) Appl. No.: 16/800,929

(22) Filed: Feb. 25, 2020

(65) Prior Publication Data
US 2020/0337175 A1 Oct. 22, 2020

Related U.S. Application Data

(63) Continuation-in-part of application No. 16/390,655, filed on Apr. 22, 2019, now Pat. No. 11,052,742, and
(Continued)

(51) Int. Cl.
*H05K 7/20* (2006.01)
*B60L 15/00* (2006.01)
(Continued)

(52) U.S. Cl.
CPC .................. *H05K 7/18* (2013.01); *B60K 1/02* (2013.01); *B60L 15/007* (2013.01);
(Continued)

(58) Field of Classification Search
CPC .. H05K 7/18; H05K 7/20545; H05K 7/20854; H05K 7/1432; B60K 1/02;
(Continued)

(56) References Cited

U.S. PATENT DOCUMENTS 5,966,084 A 10/1999 Lumbis et al.
6,175,865 B1 1/2001 Dove et al.
(Continued)

FOREIGN PATENT DOCUMENTS

CN 105580503 A * 5/2016 ............ H02M 7/003
DE 202015105878 U1 * 12/2015 ............ H02M 7/003
(Continued)

OTHER PUBLICATIONS

English Translation of Search Report for corresponding Eurasian Patent Application No. 202090789 dated Nov. 16, 2020 (2 pages).
(Continued)

*Primary Examiner* — Steve Clemmons
(74) *Attorney, Agent, or Firm* — The Small Patent Law Group LLC; Joseph M. Butscher

(57) ABSTRACT

A modular rack system and method includes a rack having plural electrical interfaces, and plural module panels configured to mate with the electrical interfaces of the rack. The module panels have one or more of a common exterior size or a common exterior shape. At least two of the module panels have different internal electrical components configured to perform different operations. The rack is configured to be conductively coupled with a power delivery system of a vehicle and the module panels are configured to modify electric current prior to the electric current being supplied to the power delivery system of the vehicle.

22 Claims, 19 Drawing Sheets

Related U.S. Application Data a continuation-in-part of application No. 16/390,694, filed on Apr. 22, 2019, now Pat. No. 11,239,521, and a continuation-in-part of application No. 16/390,614, filed on Apr. 22, 2019, now Pat. No. 11,102,900.

(51) Int. Cl.
*H05K 7/18* (2006.01)
*B60K 1/02* (2006.01)
*H01R 13/518* (2006.01)

(52) U.S. Cl.
CPC ....... *H01R 13/518* (2013.01); *H05K 7/20545* (2013.01); *H05K 7/20854* (2013.01); *B60L 2210/40* (2013.01)

(58) Field of Classification Search
CPC . B60L 15/007; B60L 2210/40; H01R 13/518; Y02T 10/64
See application file for complete search history.

(56) References Cited

U.S. PATENT DOCUMENTS

| | | | |
|---|---|---|---|
| 6,490,523 B2 | 12/2002 | Doner | |
| 8,094,435 B2* | 1/2012 | Howes | H05K 7/1432 |
| | | | 439/378 |
| 8,532,850 B2 | 9/2013 | Cooper et al. | |
| 9,260,946 B2* | 2/2016 | Sneisen | H01M 10/4257 |
| 9,357,668 B2* | 5/2016 | Jones | H05K 7/1432 |
| 10,263,536 B2* | 4/2019 | Nikolov | H02M 7/493 |
| 10,454,254 B2* | 10/2019 | Kin | H05K 7/20909 |
| 10,454,349 B2* | 10/2019 | Ratadiya | H02M 7/003 |
| 2006/0180709 A1 | 8/2006 | Breton et al. | |
| 2007/0188130 A1 | 8/2007 | Scheucher | |
| 2009/0248226 A1 | 10/2009 | Kellner et al. | |
| 2010/0328848 A1* | 12/2010 | Ledezma | H02P 27/14 |
| | | | 361/603 |
| 2010/0328883 A1* | 12/2010 | Ledezma | H05K 7/1432 |
| | | | 363/34 |
| 2011/0133559 A1 | 6/2011 | Yamashita et al. | |
| 2014/0028029 A1 | 1/2014 | Jochman | |
| 2014/0157008 A1 | 6/2014 | Ammu et al. | |
| 2015/0134156 A1 | 5/2015 | Henry | |
| 2015/0358199 A1 | 12/2015 | Komura et al. | |
| 2016/0172997 A1* | 6/2016 | Andris | H05K 7/1432 |
| | | | 363/71 |
| 2017/0036660 A1 | 2/2017 | Humphrey | |

FOREIGN PATENT DOCUMENTS

| | | | | |
|---|---|---|---|---|
| EP | 1853098 A2 | * | 11/2007 | ........... H05K 7/1432 |
| EP | 2947764 A1 | * | 11/2015 | ........... H02M 5/297 |
| FR | 3027483 A3 | * | 4/2016 | ........... H05K 7/1432 |
| GB | 2487365 | | 7/2012 | |
| KR | 102064110 B1 | * | 1/2020 | |
| RU | 2551411 C2 | | 5/2015 | |
| WO | WO-2011008514 A2 | * | 1/2011 | ........... H02M 7/003 |
| WO | WO-2012136465 A2 | * | 10/2012 | ........... H05K 5/0021 |
| WO | 2012170990 | | 12/2012 | |
| WO | 20014188487 | | 11/2014 | |
| WO | WO-2016026514 A1 | * | 2/2016 | ........... H02M 7/003 |
| WO | 2017096173 A1 | | 8/2017 | |

OTHER PUBLICATIONS

Search Report for corresponding Eurasian Patent Application No. 202090789 dated Nov. 16, 2020 (3 pages).
H1961, issued Jun. 2001, to Runyon.
English Translation of Russian Office Action Patent Application No. 202090789/31 dated Feb. 7, 2022.
Russian Office Action Patent Application No. 202090789/31 dated Feb. 7, 2022.
First Examination Report received for related Australian Patent Application No. 2020202350 dated Jun. 7, 2022 (3 pages).

* cited by examiner

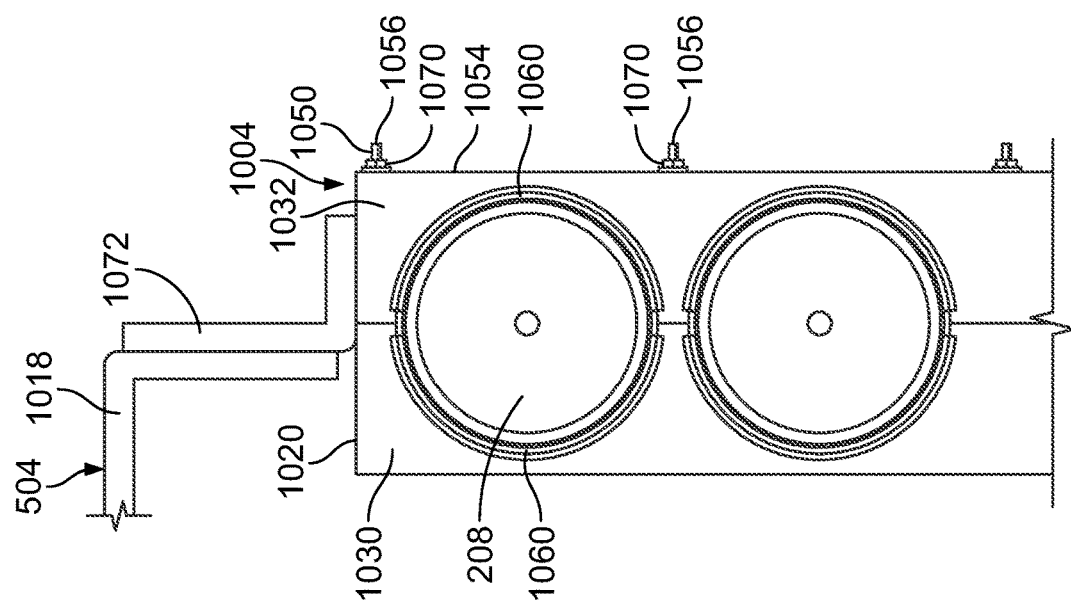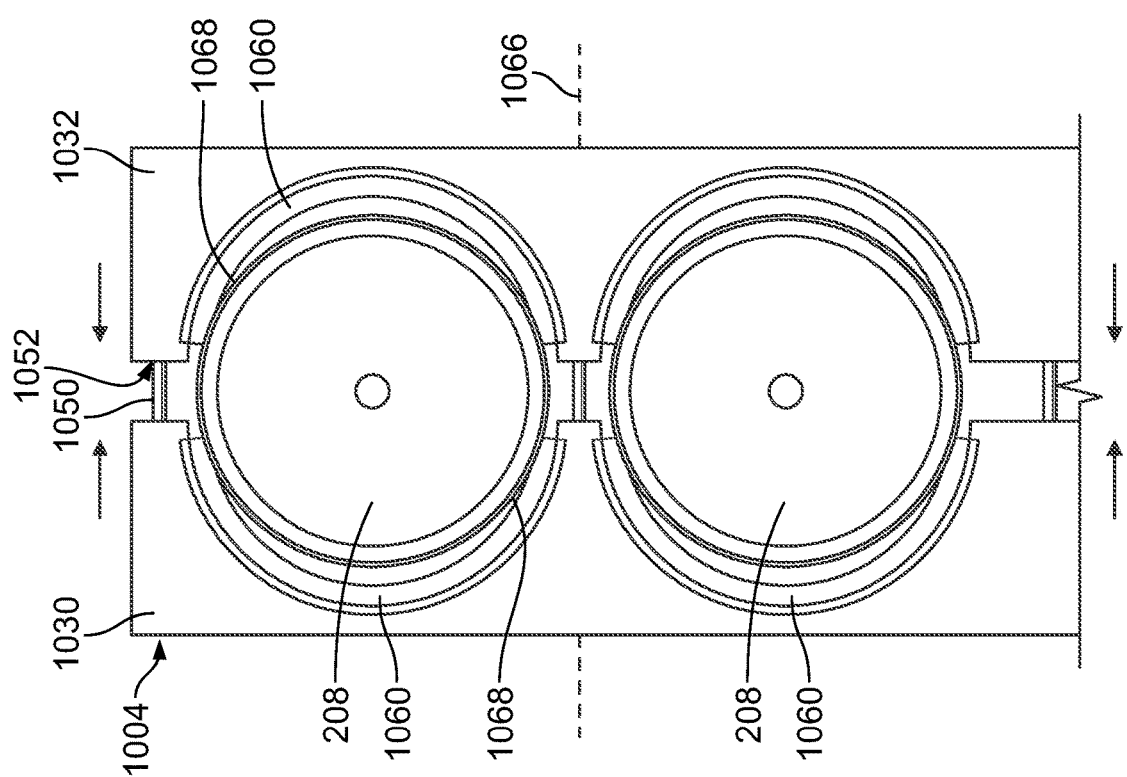

MODULAR RACK SYSTEM AND METHOD

CROSS-REFERENCE TO RELATED APPLICATIONS

This application is a continuation-in-part of U.S. patent application Ser. No. 16/390,614, which was filed 22 Apr. 2019, and the entire disclosure of which is incorporated herein by reference.

This application is also a continuation-in-part of U.S. patent application Ser. No. 16/390,655, which was filed 22 Apr. 2019, and the entire disclosure of which is incorporated herein by reference.

This application is also a continuation-in-part of U.S. patent application Ser. No. 16/390,694, which was filed 22 Apr. 2019, and the entire disclosure of which is incorporated herein by reference.

BACKGROUND

Technical Field

Embodiments of the inventive subject matter described herein relate to systems for delivering electrical power to various components for performing work.

Discussion of Art

Some vehicles employ electrically motorized wheels for propulsion and dynamic braking. For example, hybrid vehicles may include engines in conjunction with alternators, rectifiers, inverters, and the like, that are connected to the wheels of the vehicles via traction motors. The alternator converts mechanical energy into electrical energy that is transmitted to the traction motors which transform the electrical energy back into mechanical energy to drive the wheels during a propel mode of operation.

At least some known power delivery systems that include alternators, rectifiers, inverters, motors, capacitors, resistors, inductors, and/or the like have these components arranged in multiple discrete assemblies that are spaced apart and electrically connected via conductive elements, such as electrical cables. For example, the inverters may be located proximate to the traction motors, and the rectifier may be spaced apart from the inverters and connected to the inverters via lengths of electrical cable of one or more meters. The discrete packaging and spacing between the components of the power delivery systems may occupy significant space on a vehicle, which may be in limited supply. Furthermore, the transmission of electric current over distances between the various components may result in power loss (e.g., due to resistance along the lengths of the conductors), which reduces efficiency. In addition, the distances between components may require utilization of larger and heavier components (e.g., larger capacitors or the like) than if the components were more closely packaged, which increases the vehicle weight and reduces fuel efficiency of the vehicle, as well as further limits available space on the vehicle. It may be desirable to have systems and methods that differ from those that are currently available.

BRIEF DESCRIPTION

In one or more embodiments, an electrical power delivery system is provided that includes a module stack, a conductive bus bar, and one or more energy storage devices. The module stack includes multiple modules stacked side by side along a stack axis. Each of the modules has a respective housing and internal electrical components within the housing. The conductive bus bar is oriented along a plane parallel to the stack axis. The bus bar is mounted along a side of the module stack and electrically connected to one or more of the modules. The one or more energy storage devices are electrically connected to the bus bar and extend from a side of the bus bar facing away from the module stack such that the bus bar is disposed between the one or more energy storage devices and the module stack.

In one or more embodiments, an electrical power delivery system is provided that includes a module stack and a bus bar. The module stack includes multiple modules stacked side by side along a stack axis. Each of the modules has a respective housing and internal electrical components within the housing. The bus bar is mounted along a side of the module stack and electrically connected to one or more of the modules. The bus bar includes a laminated assembly of multiple conductor planes. Modules of the module stack include a rectifier module between two inverter modules. The rectifier module is configured to distribute electric current to the two inverter modules via the bus bar. The internal electrical components of the rectifier module are configured to convert electric current received from a power source from an alternating current format to a direct current format. The internal electrical components of the two inverter modules are configured to convert the electric current received from the rectifier module from the direct current format to the alternating current format.

In one or more embodiments, an electrical power delivery system is provided that includes a module stack and a conductive bus bar. The module stack includes multiple modules stacked side by side along a stack axis. Each of the modules has a respective housing and internal electrical components within the housing. The housings of the modules in the module stack have a same form factor. The conductive bus bar is mounted along a side of the module stack and electrically connected to one or more of the modules. The internal electrical components of at least two of the modules in the module stack have a same configuration. The internal electrical components of at least one module in the module stack are different from the internal electrical components of another module in the module stack.

In one or more embodiments, a modular rack system includes a rack having plural electrical interfaces, and plural module panels configured to mate with the electrical interfaces of the rack. The module panels have one or more of a common exterior size or a common exterior shape. At least two of the module panels have different internal electrical components configured to perform different operations. The rack is configured to be conductively coupled with a power delivery system of a vehicle and the module panels are configured to modify electric current prior to the electric current being supplied to the power delivery system of the vehicle.

The internal electrical component of at least one of the module panels may include a switch of an inverter and the internal electrical component of at least another of the module panels may include a diode of a rectifier.

In at least one embodiment, a controller is configured to be conductively coupled with the rack and to control operation of the internal electrical components of the module panels. The module panels may include connectors configured to mate with the electrical interfaces of the rack. The controller may be configured to identify the internal electrical components of each of the module panels based on a strap mode of the connectors of the module panels.

The rack may be configured to receive and mate with one or more additional module panels to expand an operative capability of the module panels previously coupled with the rack. For example, the rack may initially have two module panels that each includes an inverter for powering a separate motor of a vehicle. The rack may receive two additional module panels that each includes another inverter for powering an additional, separate motor of the same vehicle.

The rack may be configured to swap out at least a first module panel of the module panels with a different, second module panel to change an operative capability of the module panels previously coupled with the rack.

Heat sink interfaces may be coupled with the rack and shaped to thermally couple with any of the module panels.

The internal electrical components of the module panels coupled with the rack may include one or more inverters configured to convert a direct current into an alternating current for powering one or more traction motors of the vehicle. The rack may be configured to receive one or more additional module panels having one or more inverters to convert the direct current into the alternating current for powering one or more additional traction motors of the vehicle. As an example, the one or more inverters may include at least two inverters; the one or more traction motions may include at least two traction motors; the one or more additional module panels may include at least two additional module panels; and the one or more additional traction motors may include at least two traction motors.

In one or more embodiments, a modular rack method includes mating plural module panels with electrical interfaces of a rack. The module panels have one or more of a common exterior size or a common exterior shape. At least two of the module panels have different internal electrical components configured to perform different operations. The modular rack method also includes conductively coupling the rack with a power delivery system of a vehicle, and modifying (by the module panels) electric current prior to the electric current being supplied to the power delivery system of the vehicle.

In one or more embodiments, a vehicle includes a power delivery system, and a modular rack system, examples of which are described herein.

In one or more embodiments, a module panel includes an exterior housing, at least one heat sink disposed in the housing, a power delivery circuit disposed in the housing and coupled to one side of the at least one heat sink, and a controller circuit disposed in the housing and coupled to an opposite side of the at least one heat sink. The power delivery circuit operates using one or more different voltages than the controller circuit. As an example, the at least one heat sink includes a first heat sink proximate to the power delivery circuit, and a second heat sink proximate to the controller circuit.

The housing may include one or more connectors conductively coupled with the power delivery circuit and with the controller circuit. The one or more connectors are configured to interchangeably mate with any of plural electrical interfaces of a rack in a modular rack system such that the housing is interchangeable in the rack with one or more other module panels having one or more electronic circuits that perform another function.

The housing may be formed from a non-conductive material. In at least one embodiment, no conductive path exists between the housing and a weldment or another enclosure of the modular rack system while the housing is coupled with the rack of the modular rack system.

The housing may include ports through which air flows through the housing along a flow direction. The at least one heat sink may include several fins spaced apart from each other in directions that are orthogonal to the flow direction.

The at least one heat sink may be formed from a bimetallic material. The at least one heat sink may be formed from a plate elongated in orthogonal directions of a plane that is parallel to the circuits. The at least one heat sink may include elongated, spaced-apart fins projecting from the plate. The plate may be formed from a first metal, and the fins may be formed from a different, second metal. Optionally, the at least one heat sink may be formed of a single metal. For example, the at least one heat sink may be a monometallic copper heat sink.

The power delivery circuit may operate using greater voltages than the controller circuit. The power delivery circuit may be disposed vertically above the controller circuit. The power delivery circuit may be configured to change an electric current supplied to a traction system of a vehicle and the controller circuit is configured to control operation of the power delivery circuit.

The housing may be formed from a composite material. For example, the housing may be formed from a polymer shell having one or more connector channels and metal support liners disposed inside the one or more connector channels. The composite material from which the housing is formed may be thermally conductive but electrically insulative. The housing may be formed from a non-metallic material. Optionally, the housing may be formed of, and/or include at least one metal, and integrated with a heat sink, for example.

In one or more embodiments, a method includes disposing at least one heat sink a housing of a module panel, disposing a power delivery circuit in the housing, coupling the power delivery circuit to one side of the at least one heat sink, disposing a controller circuit in the housing, coupling the controller circuit to an opposite side of the at least one heat sink, using one or more first voltages to operate the power delivery circuit, and using one more second voltages that differ from the first voltages to operate the controller circuit.

BRIEF DESCRIPTION OF THE DRAWINGS

Reference is now made briefly to the accompanying drawings, in which:

FIG. 8 is a diagram illustrating a component stack-up within the housing of the module shown in FIGS. 3 through 7 according to an embodiment;

FIG. 31 illustrates a portion of one of the support structures shown in FIGS. 27 through 30 in a partially assembled state according to an embodiment;

FIG. 32 shows the portion of the support structure of FIG. 31 in a fully assembled state according to an embodiment;

DETAILED DESCRIPTION

Embodiments of the inventive subject matter described herein relate to systems for delivering electrical power to various components for performing work. Certain embodiments relate to systems for delivering electrical power to motors on vehicles. In one embodiment, an electrical power delivery system is provided. The system may include a module stack, a conductive bus bar, and one or more energy storage devices. The module stack may include multiple modules stacked side by side along a stack axis. Each of the modules may have a respective housing and internal electrical components within the housing. The conductive bus bar may be oriented along a plane parallel to the stack axis, mounted along a side of the module stack, and electrically connected to one or more of the modules. The energy storage devices may be electrically connected to the bus bar and extend from a side of the bus bar facing away from the module stack such that the bus bar is disposed between the energy storage devices and the module stack.

Figure 1:
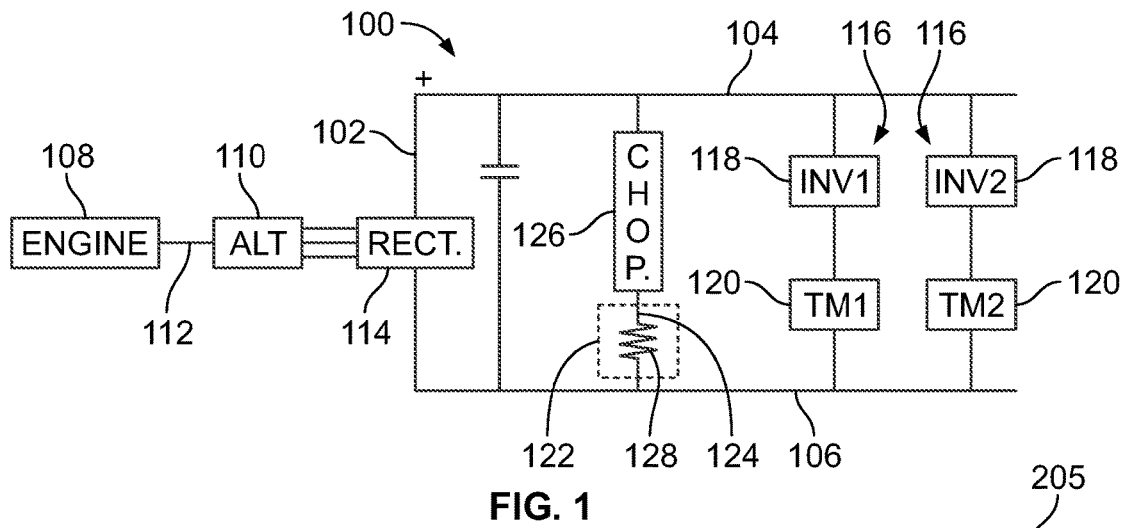
FIG. 1 is a schematic circuit diagram of a system according to an embodiment.

A schematic circuit diagram of a system 100 according to an embodiment is shown in FIG. 1. The system may be a power delivery system useful for propulsion. The system may be onboard a vehicle. The system may include a traction bus 102. The traction bus may have a positive rail 104 and a negative rail 106. The system may include an engine 108 and an alternator 110. The alternator may be mechanically coupled to the engine via a mechanical linkage 112. The mechanical linkage may be a shaft.

A suitable engine may be a diesel engine, a gasoline engine, a multi-fuel engine, or the like. The engine drives the alternator via the mechanical linkage, such as by rotating the shaft to rotate a rotor of the alternator. The alternator and engine may be selected with reference to their performance characteristics relative to each other (such as the torque output of the engine with the torque acceptance level of the alternator, the engine speed vs the alternator speed, and the like), and with further reference to the intended end use application. Depending on the voltage, current demands of the application, various components and materials may be selected. Further, spacing and air gaps may determine spacing and insulation values for some components. Lastly, thermal considerations may be used to select suitable components for such end use applications.

With regard to the alternator 110, the alternator receives mechanical torque and from that generates electrical energy (e.g., electric current) that is conveyed along the traction bus 102 to various components to power various loads. The alternator is electrically connected to a rectifier 114. The alternator converts mechanical energy from the engine to electric current in alternating current (AC) format (referred to herein as AC current). The rectifier receives the AC current from the alternator and converts the AC current to electric current in direct current (DC) format (referred to herein as DC current). The DC current output from the rectifier is supplied to the positive rail of the traction bus. The traction bus, including the positive and negative rails, may be referred to as a DC link that provides DC current to various components of the system.

The system may include two motor subassemblies 116 connected between the positive and negative rails of the traction bus. Each motor subassembly may include a respective inverter 118 and traction motor 120. The inverters are labeled as INV1 and INV2 in FIG. 1, and the traction motors are labeled as TM1 and TM2. The two motor subassemblies may be coupled to wheels on the same axle or different axles of a vehicle. The traction motors may be AC motors. The inverters may convert DC current from the rectifier to three-phase AC current for the respective traction motors. The system optionally may have more or less than two motor subassemblies. In another embodiment, the motors may be DC motors, with inverters being configured to convert DC from the DC link into a DC power waveform suitable for powering the DC motors.

The system also may include at least one chopper circuit 126 (referred to herein as a chopper) electrically connected to a resistance grid 122. The resistance grid may include resistive elements 128 configured to dissipate electric current as heat. The chopper controls the flow of electric current to the resistance grid. In the illustrated embodiment the chopper is connected in series with one or more of the resistive elements to define a resistor leg 124 connected between the positive and negative rails. Only one chopper and only one resistor leg is shown in FIG. 1, but the system may have multiple choppers and/or multiple resistor legs arranged in parallel orientation in another embodiment. The resistance grid optionally may include a physical housing structure. The resistance grid is configured to dissipate thermal energy (e.g., heat) that is generated during dynamic braking. Optionally, the resistance grid may also include one or more blowers for enhancing the dissipation of heat from the grid box to an external environment. The chopper may be used to regulate a desired voltage on the traction bus (e.g., DC link) by modulating an effective resistance along the resistor leg between the positive and negative rails. The chopper may regulate electric current along the traction bus and prevent large power demands on the engine during a transition between a propel mode of operation and a dynamic braking mode of operation. Although the chopper is shown in FIG. 1 as separate from the resistance grid, the chopper optionally may be incorporated into the resistance grid.

The chopper is an electronic switching device controlled to switch between open and closed states. In the open state, the chopper does not conduct electric current from the positive rail through the respective resistor leg. In the closed state, the chopper conducts electric current through the resistor leg. When the chopper is in the closed state, at least some of the electric current conducted along the resistor leg is converted to heat that is dissipated from the grid box. The chopper may include internal electrical components such as one or more transistors, diodes, inductors, and/or the like. The transistors may include or represent insulated gate bipolar junction transistors (IGBTs), or other types of transistors. The resistive elements may be resistors that convert electrical energy into thermal energy. Although shown in FIG. 1 as separate from the chopper in some embodiments the resistive elements may be integral components of the chopper. The operation of the chopper may be controlled by signals received that are generated by one or more processors.

The system is selectively switchable to different operating modes. These operating modes may include the propel mode and the dynamic braking mode. In the propel mode, electrical energy may be generated by the alternator (which is powered by the engine) and conveyed along the traction bus to the traction motors for powering propulsion. Propulsion may include propelling a vehicle on which the system is integrated. For example, the traction motors may be mechanically coupled to wheels of a vehicle, and may rotate the wheels based on the electrical energy received. In the dynamic braking mode, the alternator may not be used to propel the vehicle. Rather, the vehicle operates in the dynamic baking mode to slow the vehicle by using the vehicle momentum and the existing rotational torque of the wheels to generate electrical energy via the traction motors (rather than the alternator). The electric current generated by the traction motors may be supplied to the traction bus. Dynamic braking may be used alone or in combination with friction-based brakes to slow the vehicle. In one embodiment, at least some of the electrical energy generated by the traction motors may be conveyed to a resistor grid to dissipate the energy as heat. Alternatively, if there is an electrical energy storage system, at least some of the electrical energy may be directed to a battery or another electrical storage device for storage and future use of the electrical energy. Alternatively, some of the electrical energy may be used in real time to power various electronic devices that consume electrical power (e.g., compressors, lights, pumps).

Figure 2:
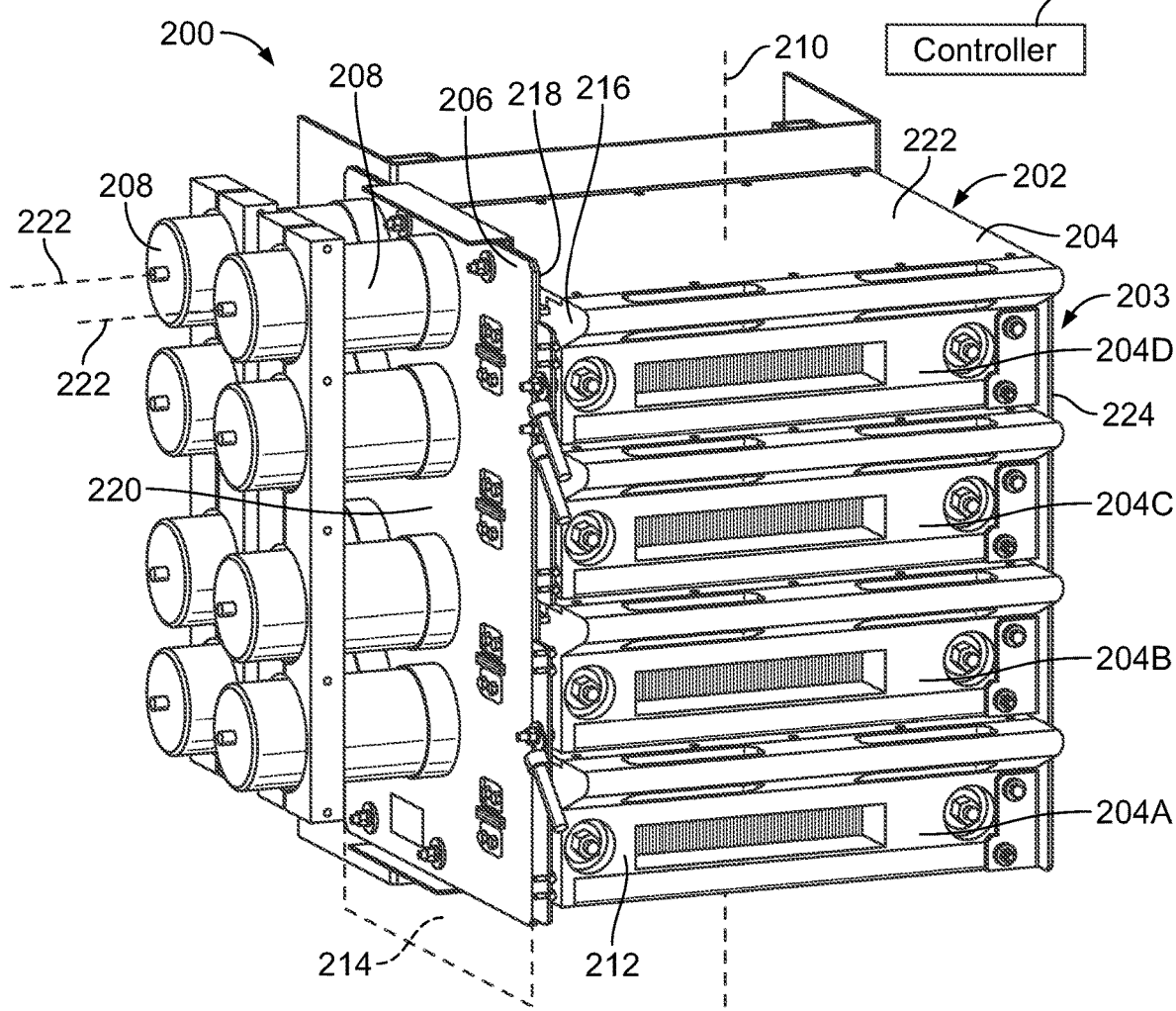
FIG. 2 is a perspective view of an electrical power delivery system according to an embodiment.

FIG. 2 is a perspective view of an electrical power delivery system 200 according to an embodiment. The electrical power delivery system has an integrated, modular design, and may represent a portion of the system shown in FIG. 1. For example, the electrical power delivery system may represent several components and/or circuitry of the system disposed between the alternator 110 and the traction motors 120, such as rectifier 114, traction bus 102 (e.g., DC link), chopper 126, and inverters 118. The electrical power delivery system may include alternate or additional components (that are of a similar or non-similar type or configuration) than the components in the system of FIG. 1, and/or may lack one or more of the components that are included in the system.

The electrical power delivery system supplies electric current for powering one or more loads. The electrical power delivery system may be incorporated onto the vehicle, such as an OHV, a rail vehicle (e.g., locomotive), a marine vessel, an automobile, or the like, for the purpose of delivering electric current with designated properties to motors used to propel the vehicle. The designated properties may include a format (i.e., electrical waveform) of the current (e.g., DC or AC), a phase of the current, a voltage of the current, a flow of the current, and/or the like. The electrical power delivery system may be configured to convert, modify, and/or transform received electric current to supply current with the designated properties to the loads. In one or more embodiments, the electrical power delivery system receives electric current from an alternator on a vehicle, and supplies electric current to one or more traction motors used to rotate a wheel or a propeller of the vehicle.

In one embodiment, the electrical power delivery system may be relatively compact. A compact package is a technical effect in that it may reduce the footprint and therefore occupy less space. In addition, the electrical power delivery system presented herein may be modular. Modularity may enable quick and efficient repair and replacement of the components. The close proximity of the components, due to the modularity and compactness, may reduce resistance-based energy loss and may enable reduction of the size and/or weight or at least some of the components.

The electrical power delivery system 200 may include various components that are coupled together to in a discrete package. The components include a modular rack system, such as or including a module stack 202, including a rack 203 of multiple modules (or module panels) 204, a conductive plane (meaning a planar body that is made of metal or otherwise able to conduct electricity, e.g., bus bar) 206, and one or more electrical energy storage devices 208. The modules or module panels in the module stack (also referred to herein as stack) are arranged side by side along a stack axis 210. Each of the modules may include a housing 212 and internal electrical components (shown in FIGS. 6 through 9) held by and/or within the housing. The stack may be arranged such that the stack axis is vertically oriented. For example, the stack axis may be parallel to the direction of gravity (gravitational force) or substantially parallel to the direction of gravity (e.g., within a designated margin of +/−1%, 2%, 5%, 1°, 2°, 5°, or the like from the direction of gravity). For example, a first module 204A is the lowermost module in the stack, a second module 204B is immediately above the first module 204A, a third module 204C is immediately above the second module 204B, and a fourth module 204D is the uppermost module in the stack. The second and third modules 204B, 204C are inner modules in the stack because these modules are bordered by the first and fourth modules 204A, 204D, which represent outer modules located at corresponding ends of the stack. In an alternative embodiment, the modules may be stacked in a different arrangement, such as in a stack axis that is orthogonal to a vertical (or height) axis. The stack optionally may include more or less than four modules to satisfy application specific parameters.

The modules have functionality relating to electric current modification, transmission, distribution, dissipation, and/or the like. For example, the internal electrical components of the modules may include transistors, diodes, inductors, conductors, switches, control circuit boards, connectors, and/or the like, as described herein in more detail. In an embodiment, at least two of the modules in the stack have different functions from one another. For example, one of the modules may be used for dissipating electric current, and another module may be used for distributing and/or modifying electric current. Optionally, at least two of the modules in the stack may be utilized to provide the same functions as each other.

The housings of the modules may have the same form factor as one another. For example, the modules or module panels may have a common exterior size and/or a common exterior shape. The form factor refers to the overall size and shape of the housing, such as the general dimensions along three mutually perpendicular axes. Two housings with the same form factor may not be identical to one another due to differences in materials, the number, location, size, and/or shape of openings through walls of the housings, the number, location, size, and/or shape of features on the walls of the housings, and the like. In FIG. 2, all four of the modules in the stack have the same form factor. For example, the housings have rectangular prism shapes (e.g., parallelepiped) that have greater lateral widths and longitudinal depths than vertical heights (along the stack axis).

In at least one embodiment, at least two of the modules have different internal electrical components than one another. The different electrical components are configured to perform different operations. For example, the internal electrical components of the fourth module 204D may have a different configuration than the internal electrical components of the third module 204C. The configuration of internal electrical components may refer to the type of electrical components and the arrangement of the components in an assembly within the respective module. The respective configuration of internal electrical components affects the functionality of the module. In an embodiment, the internal electrical components of at least two of the modules in the stack have the same configuration as one another, such that the at least two modules have the same type and arrangement of electrical components. For example, the internal electrical components of the fourth module 204D may be the same configuration as the internal electrical components of the second module 204B. The modules that have the same internal component configurations may be replicas (or copies) of one another, such that they are composed of the same type of components and are produced using the same manufacturing and assembly steps.

In an embodiment, at least one of the modules or module panels is an inverter module or inverter module panel that has a functionality similar to each of the inverters 118 of the system 100 shown in FIG. 1. The inverter module may receive electric current and modify the electric current to have designated electrical characteristics or properties for use by a particular load, such as a traction motor. For example, the inverter module may convert DC current to AC current for use by the particular load. In at least one embodiment, the internal electrical component of the invert module or inverter module panel includes a switch of an inverter.

In at least one embodiment, at least one of the modules or module panels in the stack is a rectifier module or rectifier module panel that has a functionality similar to the rectifier 114 shown in FIG. 1. The rectifier module may receive AC current from a power source, such as an alternator, and may convert the AC current to DC current. The rectifier module may also distribute the DC current to various other modules in the stack, such as to the one or more inverter modules. In at least one embodiment, the internal electrical component of the rectifier module or rectifier module panel includes a diode of a rectifier.

The modules in the stack may also include at least one chopper module that functions similar to the chopper 126 shown in FIG. 1. Among other functions, the chopper module may be configured to dissipate current as heat by conveying received current to a resistance grid that may include one or more resistance elements. The chopper module may receive current from the rectifier module.

In a non-limiting example embodiment, the stack may include two inverter modules, one rectifier module, and one chopper module. The rectifier module is configured to distribute electric current received from a power source to the two inverter modules. Positioning the rectifier module between the inverter modules allows a similar current path distance from the rectifier module to each of the inverter modules, which may enable more uniform current distribution than if the rectifier module is disposed at an end of the stack. The two inverter modules may supply the current received from the rectifier module to corresponding loads, such as to two different traction motors. The chopper module may be disposed at an end of the stack. The chopper may generate and emit waveform pulses out from and/or towards the resistance grid along a current loop. Positioning the chopper module at the end of the stack may reduce the influence of electromagnetic interference (EMI) on the modules in the stack due to the waveform pulses than if the chopper module is more centrally located because of the greater separation distance from the chopper to at least some of the other modules.

In a particular arrangement of the non-limiting example embodiment described above, the first module 204A is a chopper module, the second module 204B is a first inverter module, the third module 204C is a rectifier module, and the fourth module 204D is a second inverter module. Thus, the first inverter module 204B is disposed between the rectifier module and the chopper module. Optionally, the second inverter module may be placed at the top end of the stack for thermal damage suppression and/or mitigation purposes. For example, because heat and fire generate propagates vertically upward, if the second inverter module at the top of the stack ignites or experiences thermal runaway, there is a reduced likelihood of thermal damage spreading downward to other modules in the stack than if the same inverter module is located below other modules in the stack. Furthermore, the uppermost module may be the most exposed module in the stack, providing the most access for active cooling and fire suppression techniques, such as dumping fire retardant on the module. For this reason, the stack may be arranged such that the inverter module with the greatest likelihood of fire and/or thermal runaway is placed at the top of the stack, and the other inverter module is placed below, between the rectifier module and the chopper module. In an alternative embodiment, the chopper module may be located at the top of the stack and the rectifier module may be the second module 204B between the two inverter modules. The arrangement of the modules may be based on an orientation and/or location of the electrical power delivery system onboard a vehicle, such as the location relative to a cooling fluid, relative to traction motors, relative to an electrical energy power source (e.g., an alternator), and the like.

The conductive plane 206 of the electrical power delivery system 200 is referred to herein as a bus bar. The bus bar is electrically connected to one or more modules in the stack. For example, the bus bar may be electrically connected between the rectifier module and the inverter modules to convey current from the rectifier module to the inverter modules. The bus bar may operate as a DC link, similar to the traction bus 102 shown in FIG. 1. The bus bar may include multiple conductive layers that are laminated together. The conductive layers may be metal sheets. The bus bar may be planar and oriented along a plane 214. In the illustrated embodiment, the plane of the bus bar is parallel to the stack axis 210 of the module stack. The bus bar is mounted along a side 216 of the module stack and extends across multiple of the modules. The side 216 of the stack is referred to herein as a bus side. The bus bar has a first side 218 and a second side 220 opposite the first side 218. The first side 218 faces towards the module stack. The second side 220 faces away from the module stack. The bus bar may be mounted to the module stack via one or more fasteners such as bolts, screws, nuts, clamps, clips, and/or the like.

The bus bar may be individually electrically connected to the modules via one or more conductors that extend between the first side of the bus bar and the bus side of the module stack. The conductors may include rigid metal contacts, flexible cables, and/or the like.

The rectifier module may be centrally located within the stack as one of the inner modules to achieve a uniform and even current distribution from the rectifier module along the bus bar to the inverter modules (relative to locating the rectifier module at an end of the stack). For example, the rectifier module may supply DC current to the bus bar along a central area thereof, and the bus bar spreads or distributes the current in opposite directions (up and down) to the different inverter modules. Arranging the components such that the current spreads in opposite directions along the bus bar may reduce the local thermal load on the bus bar and/or the modules. Reducing the local thermal load may reduce the risk of heat-related damage due to fire, thermal runaway, and the like, and may extend the operational lifetime and/or the increase the performance capability of the power delivery system 200.

The electrical power delivery system in the illustrated embodiment may include multiple electrical energy storage devices 208 mounted to the bus bar and electrically connected to the bus bar. The electrical energy storage devices commonly extend from the second side 220 of the bus bar (e.g., in a direction away from the module stack). The bus bar is therefore disposed between the energy storage devices and the module stack. In an embodiment, the energy storage devices are capacitors, such as DC link filter capacitors. The electrical energy storage devices are referred to herein as capacitors, although another type of electrical energy storage device, such as battery or fuel cells, may be used in addition to capacitors or instead of capacitors based on application-specific requirements.

The capacitors are cylindrical and extend from the bus bar along respective central axes 222. In the illustrated embodiment, the capacitors extend from the bus bar such that the central axes 222 are parallel to one another and perpendicular to the stack axis 210. The central axes 222 may be perpendicular to the plane 214 of the bus bar. The electrical power delivery system may include an array of eight capacitors in the illustrated embodiment, but may have more or less capacitors in other embodiments. The capacitors may have the same configuration, or at least some of the capacitors may have different configurations (e.g., different size, solid vs. electrolytic, polymer vs. ceramic, etc.). In the illustrated embodiment, the capacitors are disposed proximate to the module stack such that only the thickness of the bus bar between the first and second sides 218, 220 may separate the capacitors from the module stack. The close proximity of the capacitors to the module stack may enable reducing the number of capacitors and/or the sizes of the capacitors relative to the number and/or size of the capacitors that would be required to provide a similar degree of performance if the capacitors were spaced farther from the module stack.

The electrical power delivery system 200 shown in FIG. 2 has a relatively compact, modular shape that is useful in various applications, including vehicular applications. For example, the rectifier module may be electrically connected to a power source on a vehicle, such as an alternator that is powered by an engine. Optionally, a side 224 of the module stack that is opposite the bus side 216 may have electrical connectors for electrically connecting the modules to conductors, such as electrical cables and wires, that convey electric current to and from devices remote from the power delivery system. The side 224 is referred to herein as a connector side 224. In an embodiment, the rectifier module is electrically connected to one or more electrical cables or other conductors that extend from the connector side 224 of the module stack to the alternator (or other power source) for conveying current to the rectifier module. The rectifier module may receive AC current from the alternator and converts the AC current to DC current. The rectifier module supplies the DC current to the bus bar, which distributes the DC current to both of the inverter modules. The inverter modules may convert the DC current received into AC current and convey the AC current remotely. For example, each of the inverter modules may be electrically connected, via one or more electrical cables or other conductors, to a different corresponding traction motor that is used for rotating one or more wheels and/or one or more propellers of the vehicle. The cables may extend from the inverter modules along the connector side 224 of the module stack.

In a non-limiting example, the electrical power delivery system may be implemented onboard an OHV, such as a large mining truck. The OHV may be rated for a payload weighing up to or in excess of 100 tons. The electrical power delivery system is configured to supply current to traction motors for rotating large wheels of the OHV. For example, the OHV may have a nominal system power of 1200 horsepower. The system power may be delivered to the traction motors through the electrical power delivery system.

In at least one embodiment, a controller 205 is conductively coupled with the rack. The controller is configured to control operation of the internal electrical components of the modules or module panels.

As used herein, the term "controller," "control unit," "central processing unit," "unit," "CPU," "computer," or the like can include any processor-based or microprocessor-based system including systems using microcontrollers, reduced instruction set computers (RISC), application specific integrated circuits (ASICs), logic circuits, and any other circuit or processor including hardware, software, or a combination thereof capable of executing the functions described herein. Such are exemplary only, and are thus not intended to limit in any way the definition and/or meaning of such terms. For example, the controller can be or include one or more processors that are configured to control operation thereof, as described herein.

The controller is configured to execute a set of instructions that are stored in one or more data storage units or elements (such as one or more memories), in order to process data. For example, the controller can include or be coupled to one or more memories. The data storage units can also store data or other information as desired or needed. The data storage units can be in the form of an information source or a physical memory element within a processing machine. The one or more data storage units or elements can comprise volatile memory or nonvolatile memory, or can include both volatile and nonvolatile memory. As an example, the nonvolatile memory can comprise read only memory (ROM), programmable ROM (PROM), electrically programmable ROM (EPROM), electrically erasable PROM (EEPROM), and/or flash memory and volatile memory can include random access memory (RAM), which can act as external cache memory. The data stores of the disclosed systems and methods is intended to comprise, without being limited to, these and any other suitable types of memory.

The set of instructions can include various commands that instruct the controller as a processing machine to perform specific operations such as the methods and processes of the various embodiments of the subject matter described herein. The set of instructions can be in the form of a software program. The software can be in various forms such as system software or application software. Further, the software can be in the form of a collection of separate programs, a program subset within a larger program or a portion of a program. The software can also include modular programming in the form of object-oriented programming. The processing of input data by the processing machine can be in response to user commands, or in response to results of previous processing, or in response to a request made by another processing machine.

The diagrams of embodiments herein can illustrate one or more control or processing units, such as the controller. It is to be understood that the processing or control units can represent circuits, circuitry, or portions thereof that can be implemented as hardware with associated instructions (e.g., software stored on a tangible and non-transitory computer readable storage medium, such as a computer hard drive, ROM, RAM, or the like) that perform the operations described herein. The hardware can include state machine circuitry hardwired to perform the functions described herein. Optionally, the hardware can include electronic circuits that include and/or are connected to one or more logic-based devices, such as microprocessors, processors, controllers, or the like. Optionally, the controller can represent processing circuitry such as one or more of a field programmable gate array (FPGA), application specific integrated circuit (ASIC), microprocessor(s), and/or the like. The circuits in various embodiments can be configured to execute one or more algorithms to perform functions described herein. The one or more algorithms can include aspects of embodiments disclosed herein, whether or not expressly identified in a flowchart or a method.

As used herein, the terms "software" and "firmware" are interchangeable, and include any computer program stored in a data storage unit (for example, one or more memories) for execution by a computer, including RAM memory, ROM memory, EPROM memory, EEPROM memory, and non-volatile RAM (NVRAM) memory. The above data storage unit types are exemplary only, and are thus not limiting as to the types of memory usable for storage of a computer program.

As described herein, certain embodiments of the present disclosure provide the modular rack system that includes the rack having electrical interfaces. Modules or module panels are configured to mate with electrical interfaces of the rack. The module panels have a common exterior size and/or a common exterior shape. At least two of the module panels have different internal electrical components that configured to perform different operations.

The rack is configured to be conductively coupled with the power delivery system of a vehicle. The module panels are configured to modify electric current prior to the electric current being supplied to the power delivery system of the vehicle.

In at least one embodiment, the internal electrical component of at least one of the module panels includes a switch of an inverter. The internal electrical component of at least another of the module panels includes a diode of a rectifier.

In at least one embodiment, the controller is configured to be conductively coupled with the rack. The controller is configured to control operation of the internal electrical components of the module panels.

In at least one embodiment, the module panels include connectors that are configured to mate with the electrical interfaces of the rack. The controller is configured to identify the internal electrical components of each of the module panels based on a strap mode of the connectors of the module panels. For example, based on a predetermined strap mode of a connector, the controller identifies the internal electrical components of a module panel.

The rack may receive and mate with one or more additional module panels to expand an operative capability of the module panels previously coupled with the rack. The module panels may be selectively removed from and/or added to the rack panel to modify and/or expand operative capabilities. As an example, a first module panel may be swapped out of the rack and a different, second module panel may replace the first module panel. In general, the rack may be configured to swap out at least a first module panel of the module panels with a different, second module panel to change an operative capability of the module panels previously coupled with the rack panels with a different, second module panel to change an operative capability of the module panels previously coupled with the rack.

In at least one embodiment, heat sink interfaces are coupled with the rack and shaped to thermally couple with any of the module panels. For example, the rack may include the heat sink interfaces. The heat sink interfaces may be integrally formed with the rack. The heat sink interfaces may be configured to couple with heat sinks of the modules or module panels. In at least one other embodiment, the heat sink interface may be configured to other portions of the rack.

In at least one embodiment, the internal electrical components of the module panels coupled with the rack include one or more inverters configured to convert a direct current into an alternating current for powering one or more traction motors of a vehicle. The rack may be configured to receive one or more additional module panels having one or more inverters to convert the direct current into the alternating current for powering one or more additional traction motors of the vehicle. For example, the one or more inverters may include at least two inverters; the one or more traction motions may include at least two traction motors; the one or more additional module panels may include at least two additional module panels; and the one or more additional traction motors may include at least two traction motors.

Certain embodiments of the present disclosure provide a modular rack system that is configured to selectively add and/or remove modules or module panels to modify functionality. For example, an additional inverter module may be added for a four-wheel drive vehicle. The modular panels (for example, the modules or module panels) may have identical exteriors and interface with the rack. However, internal components of the modules or module panels may differ based on function.

In at least one embodiment, heat sink interfaces of the rack may be the same for inverter, chopper, rectifier module panels. Chopper and/or inverter functionality may be based on ethernet strapping with identical hardware, which allows the controller to know which module performs a particular function.

As described herein, certain embodiments of the present disclosure provide a modular rack method that includes mating plural module panels with electrical interfaces of a rack. The module panels have one or more of a common exterior size or a common exterior shape. At least two of the module panels have different internal electrical components configured to perform different operations. The modular rack method further includes conductively coupling the rack with a power delivery system of a vehicle, and modifying, by the module panels, electric current prior to the electric current being supplied to the power delivery system of the vehicle.

In at least one embodiment, the modular rack method also includes conductively coupling a controller with the rack, and controlling, by the controller, operation of the internal electrical components of the module panels.

In at least one embodiment, the modular rack method also includes mating connectors of the module panels with the electrical interfaces of the rack, and identifying, by the controller, the internal electrical components of each of the module panels based on a strap mode of the connectors of the module panels.

In at least one embodiment, the modular rack method includes receiving and mating, by the rack, one or more additional module panels to expand an operative capability of the module panels previously coupled with the rack.

In at least one embodiment, the modular rack method includes swapping out, from the rack, at least a first module panel of the module panels with a different, second module panel, and changing an operative capability of the module panels previously coupled with the rack due to said swapping out.

The modular rack method may include coupling heat sink interfaces with the rack, and thermally coupling the heat sink interface with one or more of the module panels.

The internal electrical components of the module panels coupled with the rack may include one or more inverters configured to convert a direct current into an alternating current for powering one or more traction motors of the vehicle. The modular rack method may include receiving, by the rack, one or more additional module panels having one or more inverters to convert the direct current into the alternating current for powering one or more additional traction motors of the vehicle.

Figure 3:
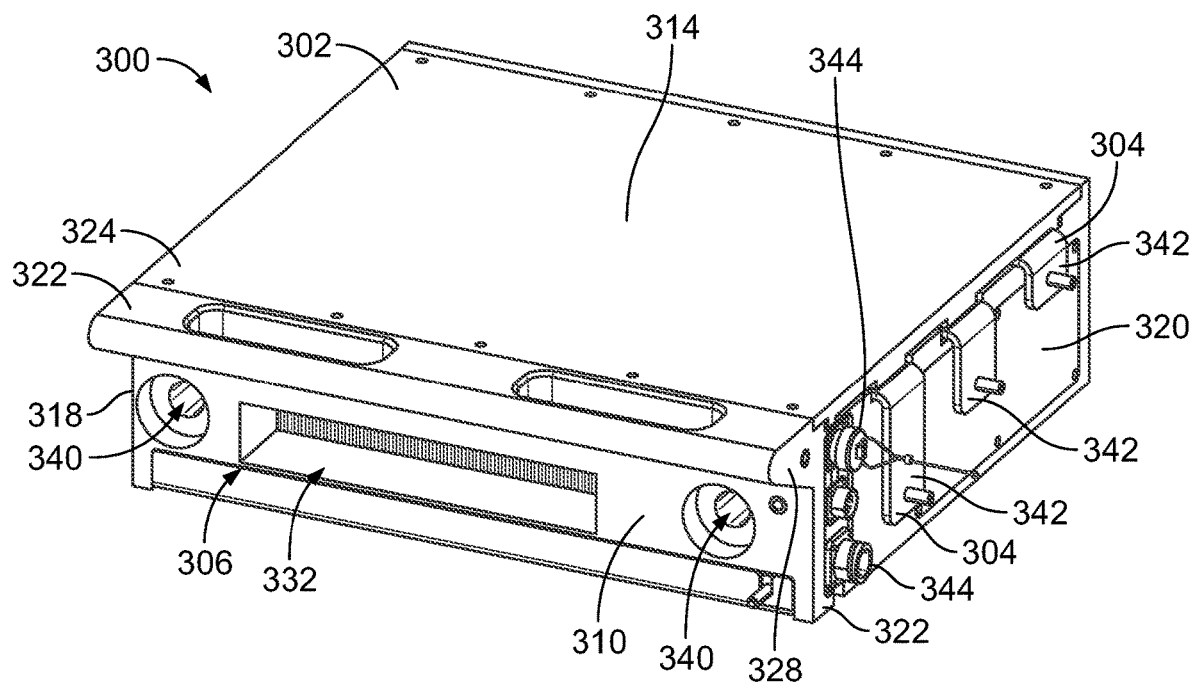
FIG. 3 is a first front perspective view of a module of an electrical power delivery system according to an embodiment.
Figure 4:
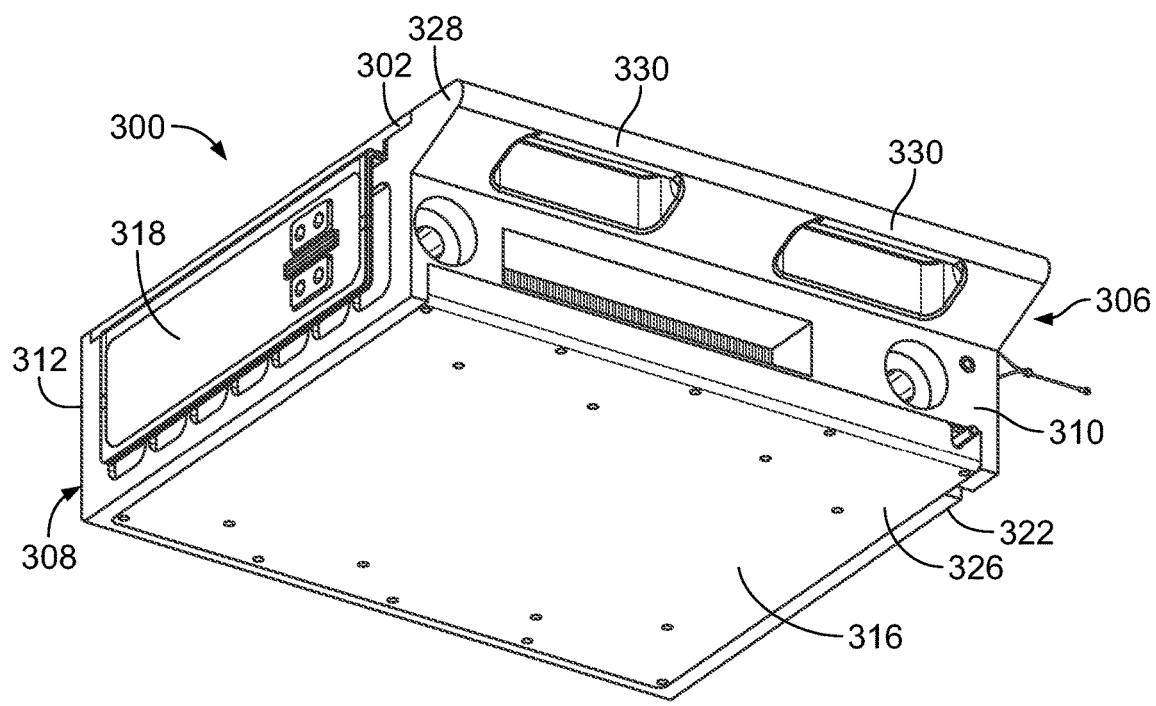
FIG. 4 is a second front perspective view of the module shown in FIG. 3.
Figure 5:
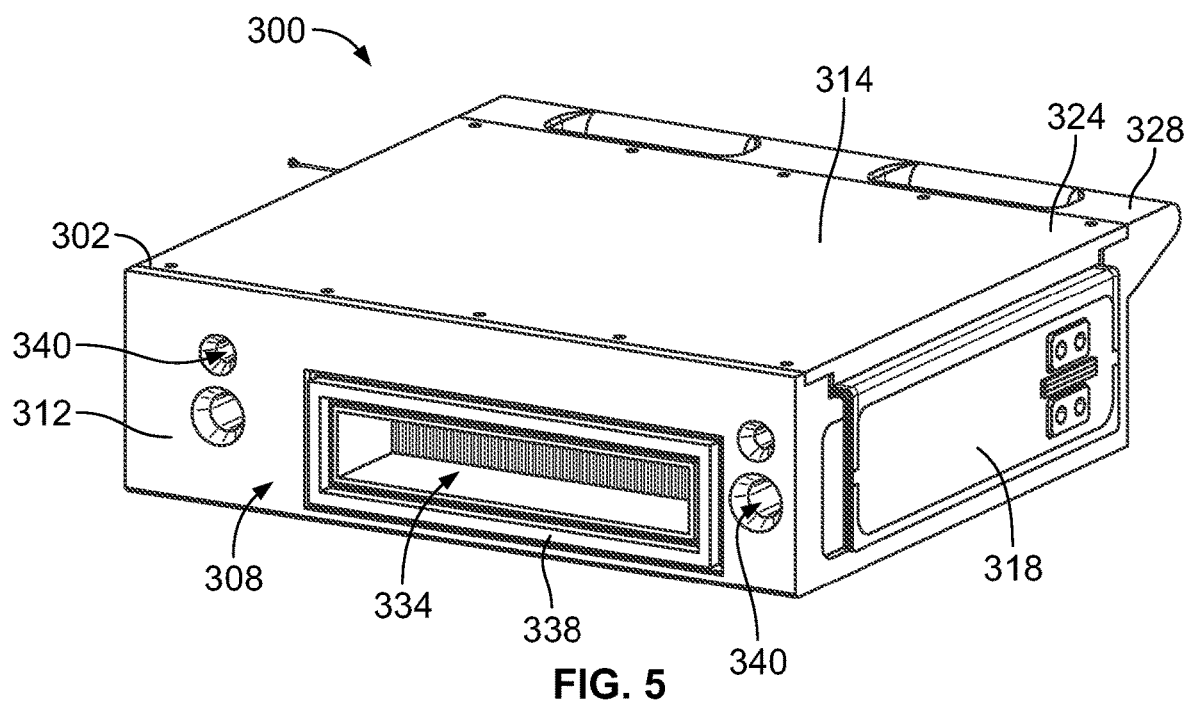
FIG. 5 is a rear perspective view of the module shown in FIGS. 3 and 4.

FIG. 3 is a first front perspective view of a module 300 of an electrical power delivery system according to an embodiment. FIG. 4 is a second front perspective view of the module 300 shown in FIG. 3. FIG. 5 is a rear perspective view of the module 300 shown in FIGS. 3 and 4. The module 300 may be one of the modules 204 of the electrical power delivery system 200 shown in FIG. 2. The module 300 may include a housing 302 and internal electrical components 304 held by the housing 302.

The housing of the module extends from a front end 306 to a rear end 308 that is opposite the front end 306. The front end is visible in FIGS. 3 and 4. The rear end is visible in FIG. 5. The housing may include a front side 310 at the front end and a rear side 312 at the rear end. The housing also has several walls extending from the front side 310 to the rear side 312, including a top side 314, a bottom side 316, a bus side 318, and a connector side 320. The bottom side is opposite the top side. The bus side is opposite the connector side. When assembled in the module stack the bus side of the module may define a portion of the bus side 216 (shown in FIG. 2) of the module stack, and the connector side of the module may define a portion of the connector side 224 (FIG. 2) of the module stack. The view in FIG. 3 shows the front side, the top side, and the connector side of the housing. The view in FIG. 4 shows the front side, the bottom side, and the bus side. The view in FIG. 5 shows the rear side, the top side, and the bus side. In a non-limiting example, the height of the housing between the top and bottom sides may be between four and ten inches, such as approximately six inches (e.g., within 0.5 inches thereof); the lateral width of the housing between the bus and connector sides may be between 18 and 24 inches, such as approximately 21 inches; and the longitudinal depth of the housing between the front and rear sides (not including the shelf) may be between 16 and 21 inches, such as approximately 18 inches.

In an embodiment, the housing may include a frame 322, an upper panel 324, and a lower panel 326. The frame may be a unitary, monolithic (e.g., one-piece) body that is seamless. Optionally, the frame may be a monolithic body composed of a composite material, such as a glass-filled polyester. The upper panel is mounted to the frame 322 to define at least a portion of the top side of the housing. The lower panel is mounted to the frame 322 to define at least a portion of the bottom side of the housing. The upper and lower panels may be about planar, except optionally along edges thereof for coupling to the frame. The housing may include a shelf 328 that projects forward beyond the front side, such that a distal end of the shelf defines the front end of the housing. The shelf may be coplanar with the upper panel. For example, a top of the shelf may define a section of the top side of the housing. In the illustrated embodiment, the shelf may include one or more handles 330 for manually moving (e.g., sliding) the module relative to the module stack, such as for loading the module into the stack or removing the module from the stack. In an alternative embodiment, the frame may be an assembly of multiple discrete frame members coupled together at joints via fasteners, adhesives, or the like.

The housing defines a front plenum opening 332 through the front side 310 and a rear plenum opening 334 through the rear side 312. The front and rear plenum openings are fluidly connected to an interior cavity 336 (shown in FIG. 6) of the housing to provide a passageway for cooling fluid (e.g., air) through the housing to absorb and dissipate heat from the module. The module in the illustrated embodiment may include a plenum gasket 338 mounted to the rear side and surrounding the rear plenum opening. The plenum gasket may be at least partially embedded in the rear side, such as within a groove along the rear side. The plenum gasket is at least partially compressible to provide a seal between the housing and a back wall of a chassis when the module is loaded in the stack. The housing also may include channels 340 that extend longitudinally through the housing from the front end to the rear end. The channels are open along the front side and the rear side. The channels are configured to receive guide rods therein for aligning and guiding movement of the module relative to the module stack when loading and unloading the module.

In an embodiment, one or more of the internal electrical components 304 of the module may protrude out of the housing to be exposed along an exterior of the housing. For example, several conductive power tabs 342 are exposed along the connector side of the housing. The power tabs 342 are configured to be electrically connected to one or more electrical connectors for conveying current to and/or from the module stack to a remote device, such as a power source or a load. The module also may include several connectors 344 mounted to the housing along the connector side proximate to the front side. The connectors 344 may be used, for example, to connect wires for transmitting control and/or data signals to control components within the module for controlling operation of the module.

Figure 6:
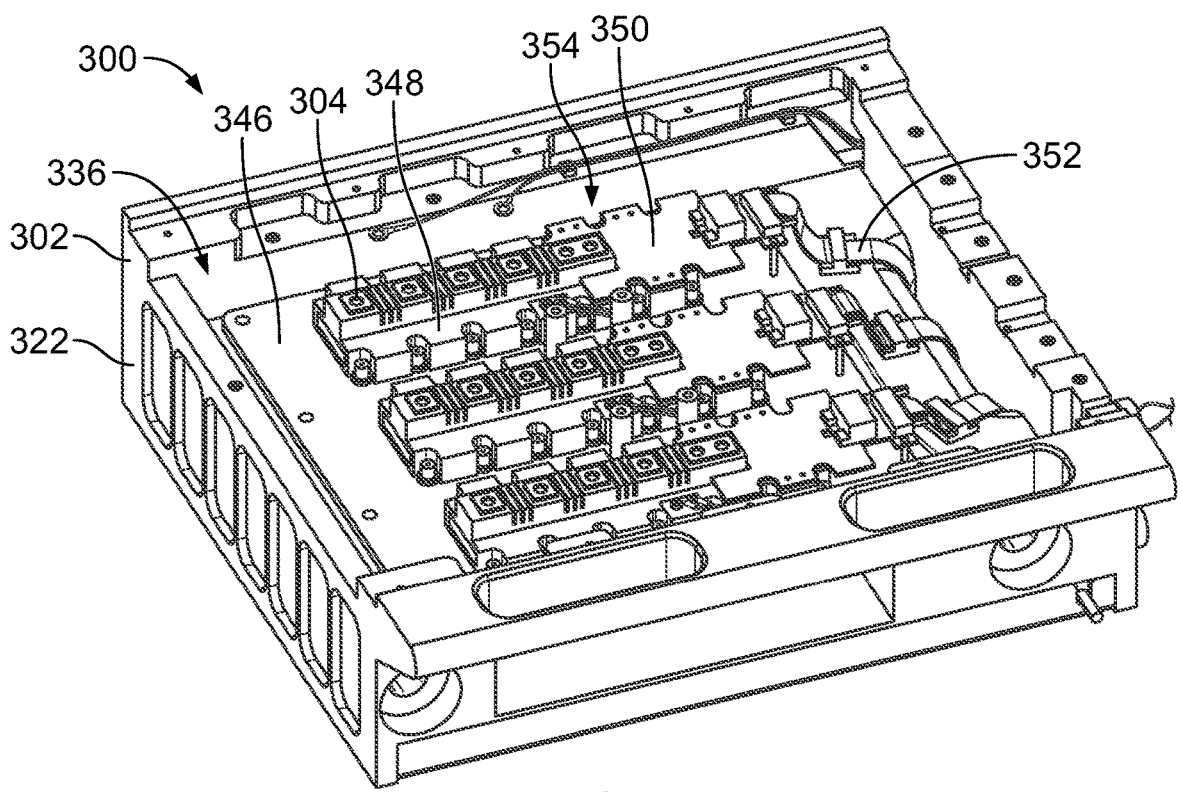
FIG. 6 is a front perspective view of the module shown in FIGS. 3 through 5 in a first partially assembled state according to an embodiment.
Figure 7:
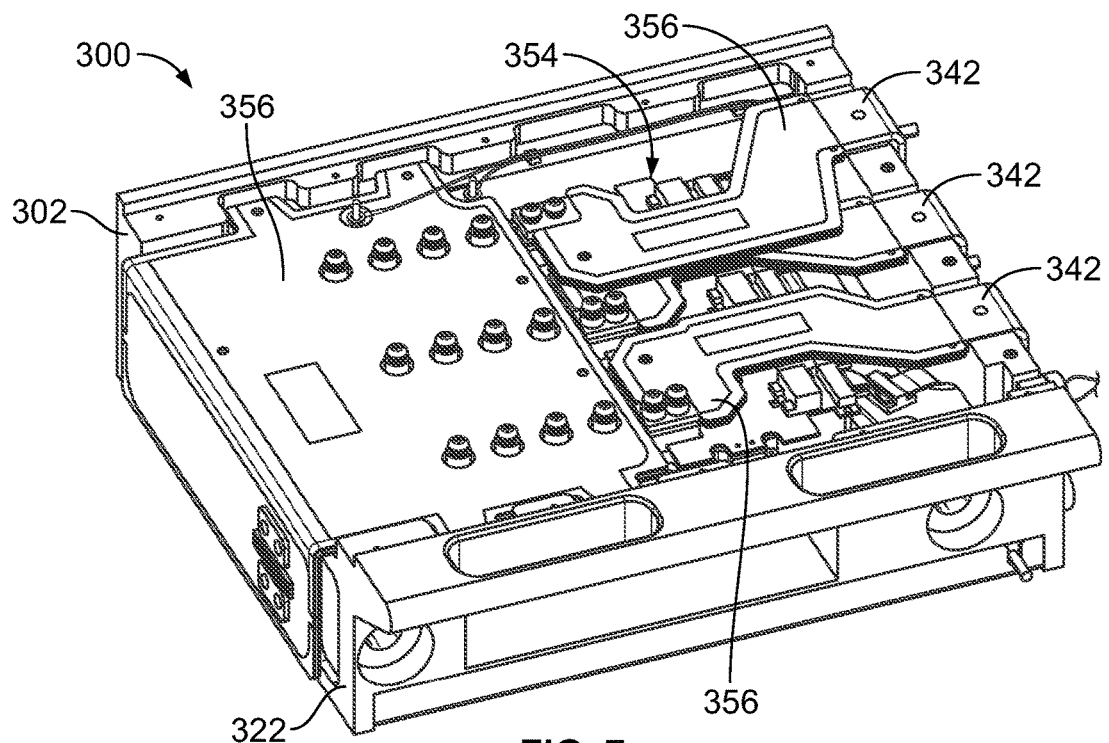
FIG. 7 is a front perspective view of the module shown in FIGS. 3 through 6 in a second partially assembly state according to an embodiment.

FIG. 6 is a front perspective view of the module 300 shown in FIGS. 3 through 5 in a first partially assembled state according to an embodiment. FIG. 7 is a front perspective view of the module 300 shown in FIGS. 3 through 6 in a second partially assembly state according to an embodiment. The upper panel is remote from the frame 322 of the housing 302 to show internal electrical components 304 within the interior cavity 336 of the housing. In FIG. 6, the module may include a heat sink 346 and internal electrical components mounted on the heat sink. The heat sinks of the modules or module panels may be configured to couple to heat sink interface of and/or coupled with the rack. The heat sink interfaces coupled to the rack are shaped to thermally couple with the modules or module panels. The internal electrical components may include transistors 348, such as insulated gate bipolar junction transistors (IGBTs) or the like. The internal electrical components also may include gate drivers 350 that are electrically connected between the transistors and ribbon cables 352. The internal electrical components disposed above the heat sink 346, including the transistors and the gate drivers, may represent power electronics 354 that are used for handling (e.g., receiving and supplying) and/or modifying (e.g., converting and transforming) electric current used to power loads.

In FIG. 7, the internal electrical components also include conductive bus bars 356 that are installed onto the power electronics 354 shown in FIG. 6. The conductive bus bars are electrically connected to the transistors. Each of the conductive bus bars may include one or more conductive layers that are laminated. The bus bars electrically connect the power electronics within the housing to the conductive power tabs 342 along the exterior of the housing.

In a non-limiting example, the module 300 may represent one of the inverter modules in the module stack and/or a chopper module in the module stack. For example, the inverter modules and the chopper module may have internal electrical components with the same configuration (e.g., the same types and arrangement of components), although the inverter modules are utilized to perform different functions than the chopper module. Therefore, the illustrated module optionally may be utilized as either one of the inverter modules or the chopper module.

FIG. 8 is a diagram illustrating a component stack-up within the housing of the module 300 shown in FIGS. 3 through 7 according to an embodiment. The conductive bus bars 356 (shown in FIG. 7) are disposed at the top of the stack immediately above the power electronics 354 (FIG. 6). The power electronics are disposed immediately above the heat sink 346 (FIG. 6), which is referred to as a first heat sink. The first heat sink is disposed immediately above a second heat sink 360, which is immediately above control electronics 362. The control electronics may include one or more circuit boards, integrated circuits, and/or the like that include one or more processing devices for controlling operations of the module. The control electronics may be mounted directly on the second heat sink. One or both of the heat sinks may include fins for dissipating heat to cooling air that flows through the interior cavity of the housing between the plenum openings 332 and 334 shown in FIGS. 3 through 5. The power electronics and the control electronics are spaced apart along opposite sides of the heat sinks (and the cooling air flow through the heat sinks). In an alternative embodiment, the module may have a single heat sink or at least three heat sinks depending on an amount of heat dissipation required for a particular application.

Figure 9:
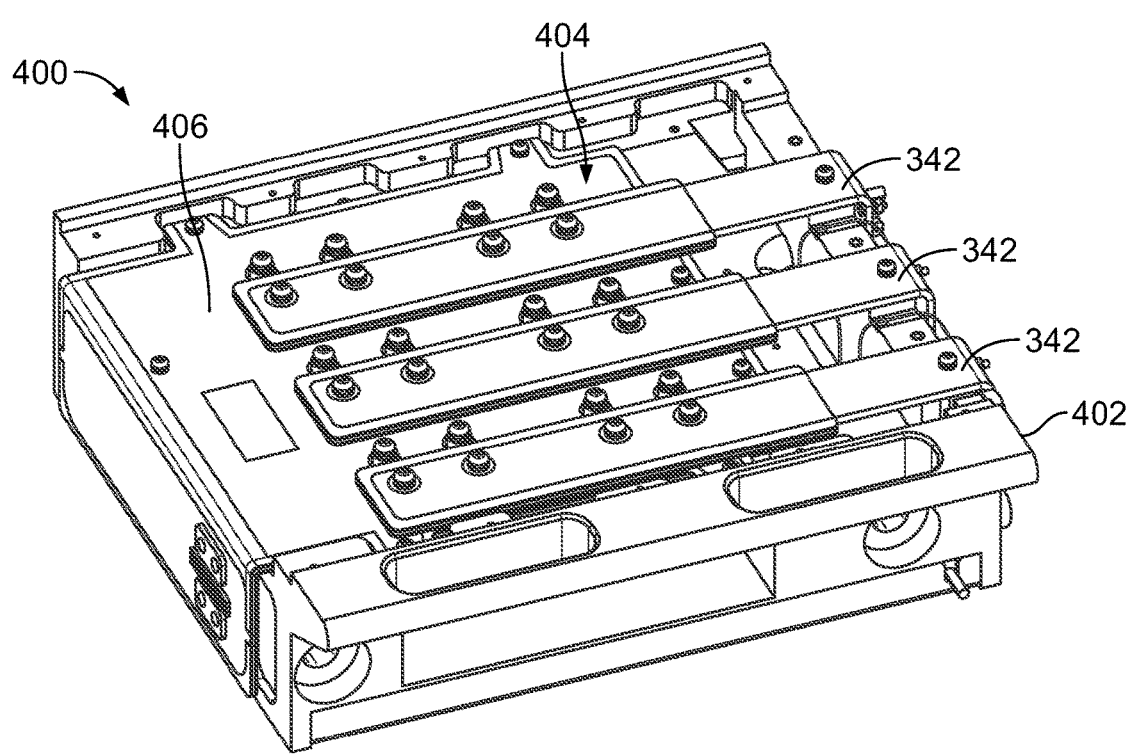
FIG. 9 is a front perspective view of a module of an electrical power delivery system according to an embodiment.

FIG. 9 is a front perspective view of a module 400 of an electrical power delivery system according to an embodiment. The module may be one of the modules 204 of the electrical power delivery system 200 shown in FIG. 2. The module 400 may include a housing 402 and internal electrical components 404 held by the housing 402. An upper panel of the housing is omitted in FIG. 9 to show some of the internal electrical components 404 within the housing 402 that would otherwise be concealed by the upper panel.

The housing 402 may be a replica of, or at least similar to, the housing 302 of the module 300 shown in FIGS. 3 through 7. For example, the housing 402 may have the same form factor as the housing 302. As described above, all of the modules in the module stack may have the same form factor, such as the same size (e.g., dimensions) and shape.

In a non-limiting example, the module 400 in FIG. 9 may represent the rectifier module (e.g., 204C) of the module stack 202 in FIG. 2. At least some of the internal electrical components 404 of the rectifier module 400 differ from the internal electrical components 304 of the inverter and/or chopper module 300. For example, the module 400 has a single conductive bus bar 406 as opposed to multiple discrete bus bars. The bus bar mechanically and electrically connects to three power tabs 342 extending along an exterior of the housing 402 for connecting to electrical cables. The electrical cables may connect the rectifier module 400 to the alternator or other power source. In addition to the difference in the bus bar, the internal electrical components 404 of the rectifier module 400 may have other differences from the internal electrical components 304 of the inverter and/or chopper module 300. For example, the rectifier module 400 may have a snubber plate instead of the second heat sink 360 (shown in FIG. 8) and a snubber card instead of a control circuit board or integrated circuit. The rectifier module 400 may also have different diodes and/or other components than the module 300. Optionally, the rectifier module 400 may include a heat sink that is a replica of, or at least similar to, the heat sink 346 of the module 300 shown in FIGS. 6 and 8.

Figure 36:
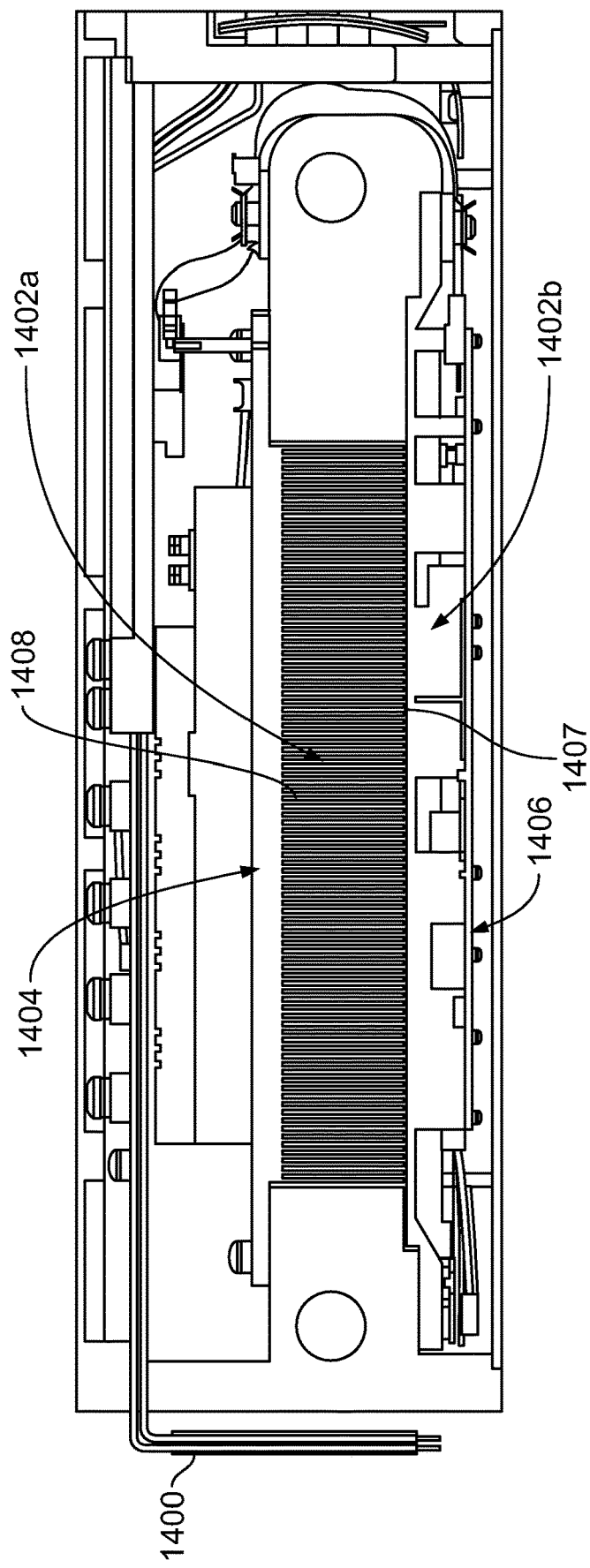
FIG. 36 is a transverse cross-sectional view of the module shown in FIGS. 3-5.

FIG. 36 is a transverse cross-sectional view of the module or module panel shown in FIGS. 3-5. The module panel includes at least one heat sink 1402 disposed in a housing 1400, which may be formed of a non-conductive material. In at least one embodiment, the module panel may include a first heat sink 1402a (such as a power side heat sink), and a second heat sink 1402b (such as a control side heat sink). Optionally, the module panel may include more or less heat sinks than shown.

A power delivery circuit 1404 is disposed in the housing. The power delivery circuit is coupled to a side (such as a top side) of the heat sink 1402a.

A controller circuit 1406 is disposed in the housing. The controller circuit is coupled to a side (such as bottom side) of the heat sink 1402b.

The power delivery circuit operates using one or more different voltages than the controller circuit. For example, the power delivery circuit may operate using a first voltage that differs from a second voltage used by the controller circuit.

In at least one embodiment, the housing includes one or more connectors conductively coupled with the power delivery circuit and with the controller circuit. The connector(s) are configured to interchangeably mate with electrical interfaces of a rack in a modular rack system such that the housing is interchangeable in the rack with one or more other module panels having one or more electronic circuits that perform another function.

In at least one embodiment, no conductive path exists between the housing and a weldment or another enclosure of the modular rack system while the housing is coupled with the rack of the modular rack system.

The housing includes ports through which air flows through the housing along a flow direction. The heat sink(s) may include several fins spaced apart from each other in directions that are orthogonal to the flow direction. The heat sink(s) may be formed from a bimetallic material. Optionally, the at least one heat sink may be formed of a single metal. For example, the at least one heat sink may be a monometallic copper heat sink.

In at least one embodiment, at least one heat sink is formed from a plate 1407 elongated in orthogonal directions of a plane that is parallel to the circuits. The heat sink may include elongated, spaced-apart fins 1408 projecting from the plate. The plate may be formed from a first metal. The fins may be formed from a different, second metal.

The power delivery circuit may operate using greater voltages than the controller circuit. As shown, the power delivery circuit may be disposed vertically above the controller circuit. In at least one embodiment, the power delivery circuit is configured to change an electric current supplied to a traction system of a vehicle and the controller circuit is configured to control operation of the power delivery circuit.

The housing may be formed from a composite material. For example, the housing may be formed from a polymer shell having one or more connector channels and metal support liners disposed inside the one or more connector channels. The composite material from which the housing is formed may be thermally conductive but electrically insulative. The housing may be formed from a non-metallic material. Optionally, the housing may be formed of, and/or include at least one metal, and integrated with a heat sink, for example.

An electrical ground path may be between the heat sink 1402b and an external structure. In at least one embodiment, a braided strap is electrically connected to the heat sink 1402b (and controller circuit, as a result) and a cover (such as an aluminum cover) of the module panel. An external aluminum grounding angle contacts the cover to create a ground path to chassis, for example.

A method includes disposing at least one heat sink a housing of a module panel, disposing a power delivery circuit in the housing, coupling the power delivery circuit to one side of the at least one heat sink, disposing a controller circuit in the housing, coupling the controller circuit to an opposite side of the at least one heat sink, using one or more first voltages to operate the power delivery circuit, and using one or more second voltages that differ from the first voltages to operate the controller circuit.

Figure 10:
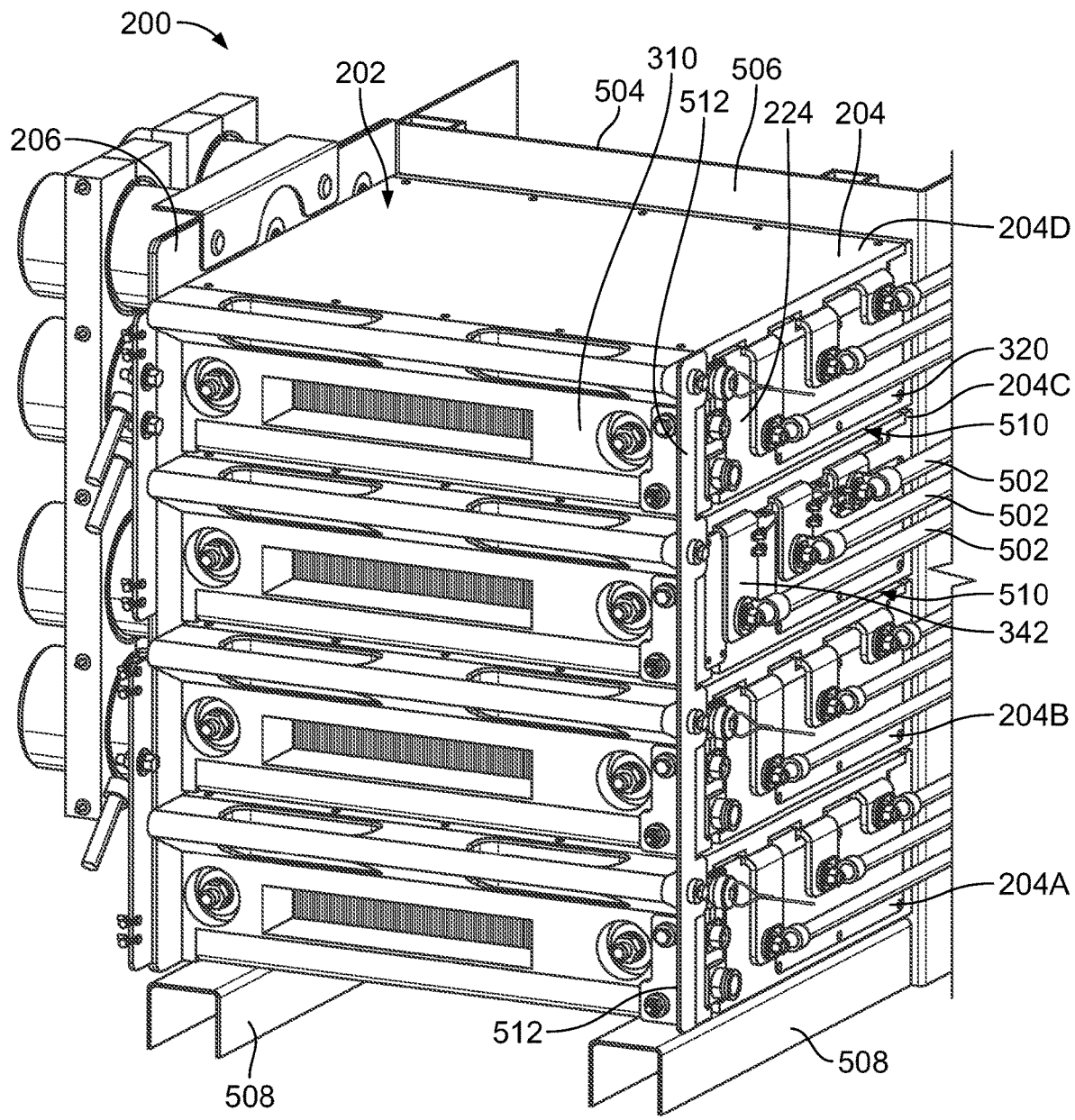
FIG. 10 is a front perspective view of the electrical power delivery system shown in FIG. 2 showing a connector side of a module stack according to an embodiment.

FIG. 10 is a front perspective view of the electrical power delivery system 200 showing the connector side 224 of the module stack 202 according to an embodiment. The conductive power tabs 342 of the modules 204 are connected to corresponding electrical cables 502 that extend remote from the module stack. For example, the cables connected to the power tabs of the inverter modules 204B, 204D may extend to different corresponding traction motors, or other loads. The cables connected to the rectifier module 204C may extend to an alternator, or another power source. The cables connected to the chopper module 204A may extend to a resistance grid for dissipating electrical energy as heat.

The electrical power delivery system may include a chassis 504 on which the modules are mounted. The chassis structurally supports the modules. The chassis may include a back wall 506 and one or more support platforms 508. The chassis has two support platforms in the illustrated embodiment. The support platforms are disposed under the module stack. The back wall may be a bulkhead that divides and separates two spaces. The rear sides of the modules, or at least the plenum gaskets 338 thereon (shown in FIG. 5), may engage and abut against the back wall when the modules are loaded into the module stack. Optionally, the bus bar 206 mounted along the module stack may be independently mounted to the chassis.

As described in more detail herein, the chassis supports the modules such that the modules in the module stack do not directly engage one another. For example, the modules are spaced apart from one another by clearance gaps 510 defined between adjacent modules in the stack. For example, a given clearance gap is defined between the bottom side of an upper module in an adjacent pair of modules and the top side of a lower module in the adjacent pair. The clearance gaps enable the flow of air between the modules for dissipating heat and for restricting and/or prohibiting the spread of fire and/or thermal runaway between modules. The clearance gaps also enable the modules to be independently removed one at a time in any order, as the lower modules in the stack do not support the weight of upper modules in the stack. Although not clearly shown in FIG. 10, even the lowermost, first module 204A may be spaced apart from the support platforms by a clearance gap when the first module is fully loaded in the module stack. The first module may temporarily engage and slide along the support members while loading and unloading the first module, but is configured to separate from the support members before achieving a fully loaded position, as described in more detail herein.

In an embodiment, the electrical power delivery system 200 also may include a support member 512 that is spaced apart from the back wall 506. The support member is mechanically coupled to multiple modules in the stack, and is configured to provide stiffening support for the modules. The support member in the illustrated embodiment is coupled to the modules at the front sides 310 thereof, such as via bolts and nuts or other fasteners. The support member may be or include a metal angle that extends along two orthogonal planes, and couples to each of the modules at a corner between the front side of the module and the connector side 320 of the module. The support member may tether the modules together to reduce movements of the modules relative to each other. For example, the support member may stiffen the module stack to maintain the size of the clearance gaps when exposed to applied forces, such as vibrations, accelerations, and impact forces, during movement of the vehicle on which the electrical power delivery system is disposed. Furthermore, the support member may be electrically conductive, and may be used to provide an electrical grounding path. For example, the support member may connect grounding elements of each of the modules to the chassis to electrically common and ground the grounding elements.

Figure 11:
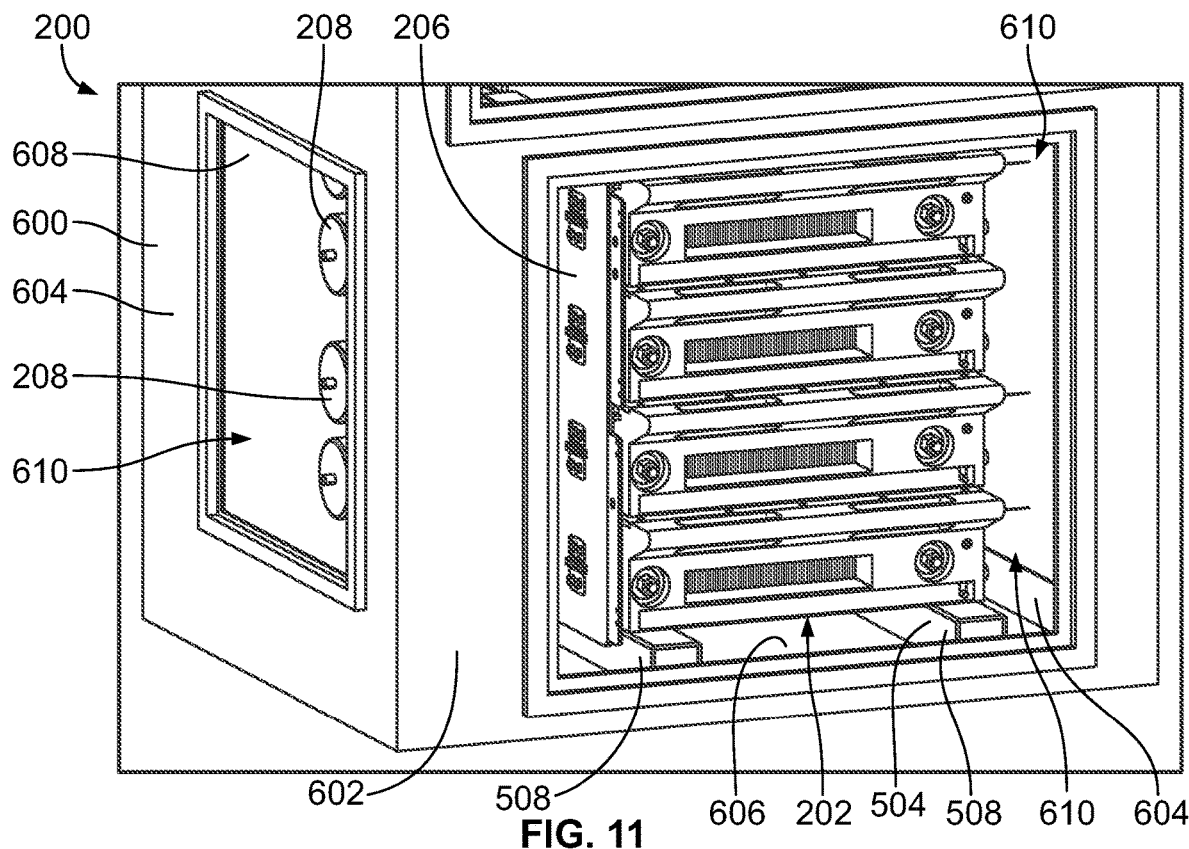
FIG. 11 is a front perspective view of the electrical power delivery system according to an embodiment.

FIG. 11 is a front perspective view of the electrical power delivery system 200 according to an embodiment. In the illustrated embodiment, the electrical power delivery system 200 may include a case 600. The module stack 202, the bus bar 206, and the energy storage devices 208 are commonly housed within the case. The chassis 504 (shown in FIG. 10) may also be housed within the case. The case has a box shape with several walls including a front wall 602, two opposing side walls 604, a bottom wall 606 under the support platforms 508, a top wall (not visible in FIG. 11), and a back wall 608 opposite the front wall. Several of the walls including the front and two side walls define windows 610 therethrough for accessing the components within the case and/or permitting air flow through the case. The case optionally may have additional windows and/or other types of openings to ensure air flow through the case and reduce weight. The case may enable the electrical power delivery system to be moved as a single, modular unit. The case may also protect the components of the system from damage from external impacts as well as debris and contaminants. Alternatively, instead of being housed within the case, the chassis may be integrated into the case as an integral portion of the case.

Figure 12:
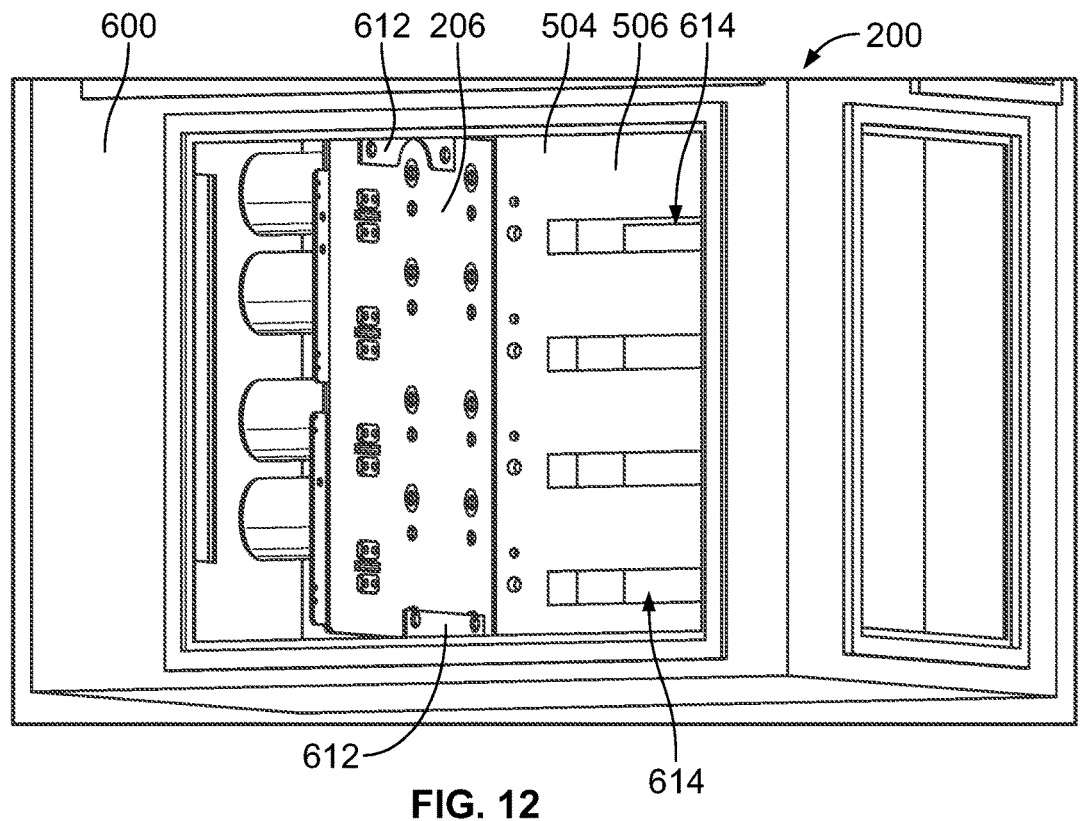
FIG. 12 is a front perspective view of the electrical power delivery system shown in FIG. 11 with the module stack omitted according to an embodiment.

FIG. 12 is a front perspective view of the electrical power delivery system 200 shown in FIG. 11 with the module stack omitted according to an embodiment. The bus bar 206 may be mounted to the case 600 and/or the chassis 504 via one or more mounting brackets 612. In the illustrated embodiment, the vertically-oriented bus bar is coupled to mounting brackets at both the top and bottom ends of the bus bar. In an embodiment, the back wall 506 of the chassis defines slots 614 therethrough. The slots are configured to align with the rear plenum openings 334 of the modules 204 (shown in FIG. 5) when the modules are mounted to the chassis to permit air flow across the back wall into the modules for cooling the internal electrical components therein.

Figure 13:
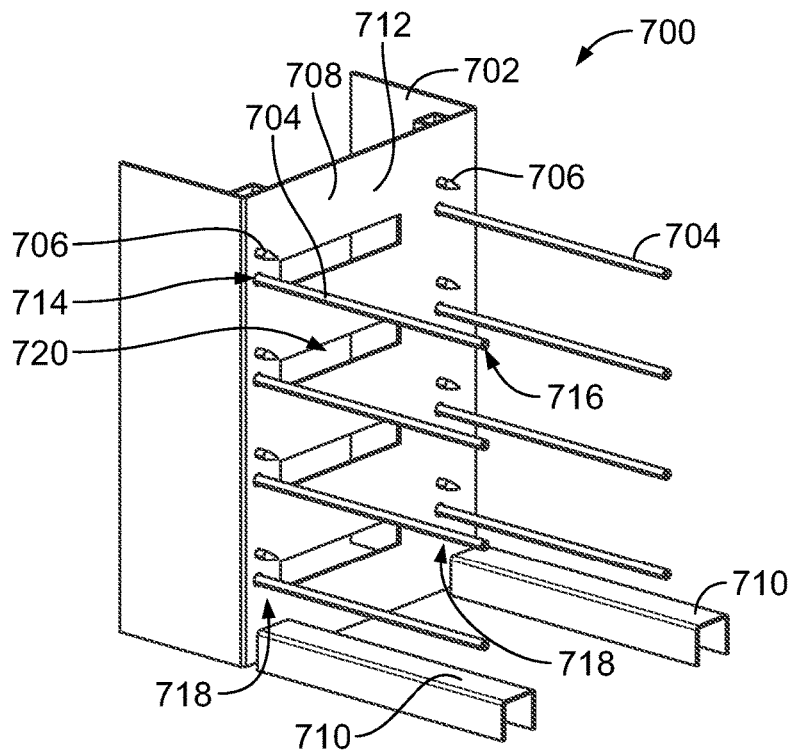
FIG. 13 is a perspective view of a mounting system for mounting modules in a module stack according to an embodiment.

FIG. 13 is a perspective view of a mounting system 700 for mounting modules in a module stack according to an embodiment. The mounting system 700 may be used for mounting the modules 204 of the electrical power delivery system 200 in the module stack 202, as shown in FIGS. 2 and 10. The mounting system is not limited to use with the modules 204 of the electrical power delivery system 200, however, as the mounting system may be used to mount other types of modules, such as server modules in a server rack, drawers in a cabinet or article of furniture, and/or the like.

The mounting system may include a chassis 702, multiple guide rods 704, and multiple lifting elements 706. The modules that are mounted may also represent components of the mounting system. No modules are shown in FIG. 13. The chassis may include a back wall 708 and at least one support platform 710. The chassis has two support platforms 710 in the illustrated embodiment. The chassis may be the same or similar to the chassis 504 shown in FIG. 10, such that the back wall 708 represents the back wall 506, and the two support platforms 710 represent the support platforms 508.

The guide rods 704 may mechanically align and guide the mounting of the modules to the chassis. For example, the guide rods may engage the modules to ensure that the modules properly align with the chassis as the modules are loaded onto the chassis. The guide rods are mechanically coupled to the back wall 708. The guide rods project from a front side 712 of the back wall. The front side faces towards the modules in the stack (when the modules are mounted). The guide rods are suspended above the support platforms. The guide rods are cantilevered to extend from a fixed end 714 at the back wall to a distal end 716 that is spaced apart from the back wall and supported in space by the rigidity of the guide rod. The guide rods may be secured in place through holes in the back wall via fasteners (such as nuts, rivets, and/or the like), punch riveting, spot welding, or the like. In the illustrated embodiment, the guide rods are arranged in two vertical columns 718. One of the guide rods in each column aligns with a corresponding guide rod in the other column to define a pair of rods. Each pair of rods is associated with a different module of the modules in the module stack. The two vertical columns are arranged on opposite sides of slots 720 defined through the back wall. The slots 720 may represent the slots 614 of the back wall 506 shown in FIG. 12. The slots 720 enable air flow through the back wall. The guide rods may have a rigid composition, such as including one or more metals. In an embodiment, the guide rods are threaded with helical threads. The guide rods of the mounting system may be replicas or copies of one another, such that the guide rods have a common size, shape, composition, and the like. Although the guide rods are arranged in two columns in the illustrated embodiment, in an alternative embodiment the guide rods may be arranged in a single column or at least three columns.

The lifting elements 706 are components mounted at or proximate to the back wall. The lifting elements are configured to mechanically engage (in direct physical contact) the modules during the mounting process. More specifically, the lifting elements are configured to at least partially support the weight of the modules when the modules achieve a fully loaded position relative to the chassis. The lifting elements may also contribute to the assembly of the electrical power delivery system by ensuring that the modules align with corresponding components that couple to the modules, such as the vertical bus bar 206, electrical connectors, side walls of the chassis, the support member 512, and/or the like. Without the lifting elements, the modules may not properly align with such components.

In the illustrated embodiment, the lifting elements are mechanically coupled to the back wall and are spaced apart from the guide rods. For example, each lifting element in FIG. 13 is discretely and independently coupled to the back wall. The lifting elements may be coupled to the back wall via fasteners (such as nuts, rivets, and/or the like), punch riveting, spot welding, or the like. The lifting elements are optionally arranged in two vertical columns that are colinear with the columns of the guide rods. Like the guide rods, the lifting elements of the different columns may align in pairs. To support the modules, the lifting elements may have a rigid composition that may include one or more metals. The lifting elements in the illustrated embodiment project from the front side of the back wall shorter lengths than the guide rods. The lifting elements shown in FIG. 13 are also referred to herein as pins.

Figure 14:
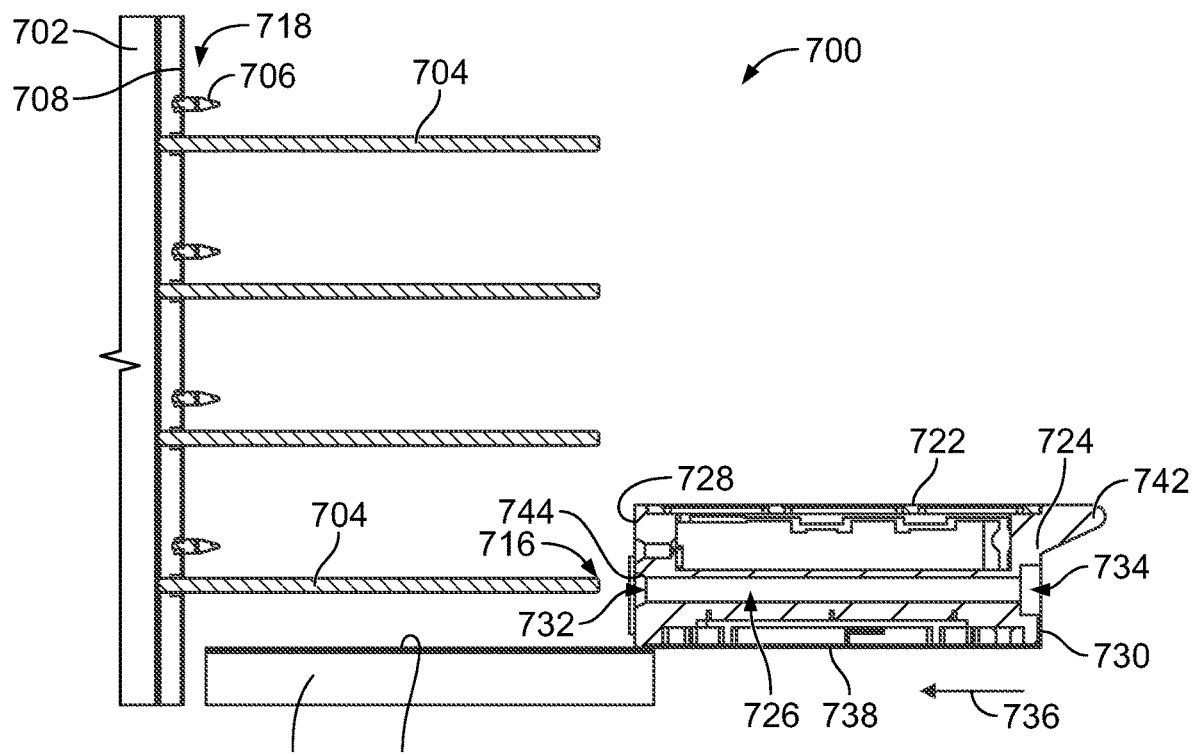
FIG. 14 is a side cross-sectional view of the mounting system showing a first module of a module stack poised for mounting according to an embodiment.

FIG. 14 is a side cross-sectional view of the mounting system 700 showing a first module 722 of a module stack poised for mounting according to an embodiment. The first module 722 may represent the lowermost module 204A shown in FIGS. 2 and 10. The cross-section is taken along a plane that extends through one of the columns 718 of the guide rods 704 and lifting elements 706, as well as through a portion of a housing 724 of the module 722. The housing 724 defines at least one channel 726 configured to receive a corresponding one of the guide rods therein. In the illustrated embodiment shown in FIGS. 13 and 14, the housing may define two channels, with each of the two channels configured to receive a different one of the two guide rods in a corresponding pair. Only one of the channels is shown in FIG. 14. The channel that is not visible in FIG. 14 receives a guide rod from the other column therein. The channels extend along a length of the module 722 between a rear side 728 and a front side 730 thereof. Each channel has a rear opening 732 at the rear side. The channels optionally extend fully from the rear side to the front side and include front openings 734 at the front side. Alternatively, the channels do not extend fully to the front side, such that the front openings to the channels are axially located between the rear side and the front side.

In an embodiment, the module is configured to be loaded in a loading direction 736 relative to the chassis 702 for mounting the module. The loading direction is towards the back wall 708. The weight of the module may be supported in whole or at least in part by the support platforms 710. For example, a bottom side 738 of the module is disposed on (e.g., in directed engagement with) a top surface 740 of the support platforms. The module may be passively moved in the loading direction by receiving an external force. For example, a human operator may grasp a handle on a shelf 742 of the module to push the module in the loading direction 736 towards the back wall. Optionally, a machine (e.g., a robot) may be programmed to push the module. The bottom side of the module may slide along the support platforms towards the back wall. For example, the force exerted on the module may be sufficient to exceed the resistance attributable to static friction between the module and the top surface of the support platforms. The mechanical support provided by the platforms may reduce the amount of force required to load the module relative to the human operator and/or machine lifting and carrying the module in the loading direction. In a non-limiting example, the module may be relatively heavy for a person to carry, such as between 50 and 150 pounds (lbs.) (e.g., 22 to 68 kg). In the illustrated embodiment, the support platforms project outward away from the back wall beyond the distal ends 716 of the guide rods 704, which allows a rear portion of the module to be placed on the support platforms prior to the guide rods being received within the channels 726.

During assembly of the module stack, the rear portion of the module may be rested on the support platforms before making any necessary adjustments to the module to align the channels with the corresponding guide rods. Once the channels are aligned with the guide rods, the module is slid on the support platform in the loading direction to cause the guide rods to enter the corresponding channels of the module. The rear openings 732 of the channels may define sloped lead-in sections 744 to reduce the risk of stubbing between the distal ends of the guide rods and the rear openings. For example, the diameter of each channel may conically taper from the rear opening at the rear side inward (in a direction towards the front side) along the sloped lead-in section.

The guide rods of a lowermost pair of guide rods are disposed a designated height above the support platforms, and the channels of the module are disposed the designated height above the bottom side of the module, to enable the guide rods to be received into the corresponding channels while the bottom side of the module is supported by the support platforms. The interaction between the guide rods and the channels may guide the module towards the back wall in proper alignment with the chassis as the module is moved in the loading direction. For example, the guide rods are oriented parallel to the loading direction. In an embodiment, the support platforms support an entirety or at least a majority of the weight of the module during an initial stage of loading the module towards the back wall. For example, the guide rods may not support any of the weight, or may only support a small percentage (e.g., less than 10%) of the weight, while the module rests on the support platforms.

Figure 15:
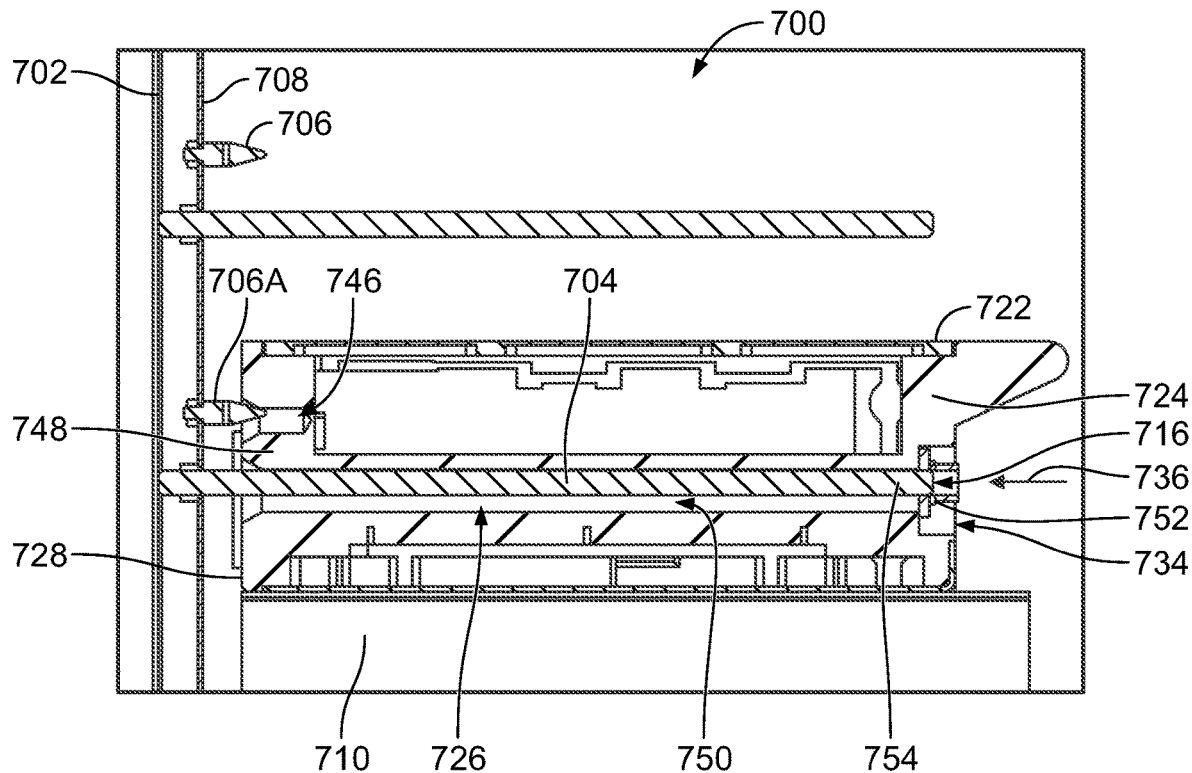
FIG. 15 is a side cross-sectional view of the mounting system showing the first module at a first intermediate loading position relative to a chassis according to an embodiment.

FIG. 15 is a side cross-sectional view of the mounting system 700 showing the first module 722 at a first intermediate loading position relative to the chassis 702 according to an embodiment. In the illustrated embodiment, the module is disposed closer to the back wall 708 than at the initial position shown in FIG. 14 due to being forced to slide along the support platforms 710 in the loading direction 736. Prior to abutting the back wall, the module engages at least one of the lifting elements 706. As described above, the lifting elements 706 in the illustrated embodiment are pins mounted on the back wall. The pins are arranged in pairs such that adjacent pairs are vertically spaced apart. The illustrated pin in FIG. 15 that engages the module is a first pin 706A (e.g., a first lifting element). The other pin in the pair with the first pin is concealed by the first pin and thus not visible in FIG. 15.

The housing 724 of the module may define at least one receptacle 746 along the rear side 728. The at least one receptacle may be spaced apart from the channels 726. For example, an intervening portion 748 of the housing separates each receptacle from a nearby channel. Based on the arrangement of the pins in pairs as shown in FIG. 13, the module may define two receptacles at the rear side, such that each of the receptacles receives a different one of the pins of the pair therein upon the module reaching the pins. The guidance and alignment provided by the guide rods 706 within the channels 726 may enable the receptacles of the module to align with the corresponding pins on the back wall, preventing (or at least reducing the likelihood of) stubbing.

In an embodiment, the module remains supported by the support platforms upon making initial physical contact with the pins. Thus, the module may slide along the support platforms in the loading direction from the position shown in FIG. 14 to the position shown in FIG. 15. The diameter of each channel 726 (e.g., even at the narrowest segment thereof) may be greater than a diameter of the corresponding guide rod 704 received therein to define an open clearance area between the guide rod and interior surfaces of the channel. In FIG. 15, while the module is supported on the support platforms, the guide rod is disposed within an upper area of the channel, and an open clearance area 750 is defined within the channel below the guide rod.

In an embodiment, once a distal end segment 754 of each of the guide rods within the channels of the module are accessible through the front openings 734 of the channels, fasteners 752 may be coupled to the distal end segments. The distal end segments extend to the respective distal ends 716 of the guide rods. The fasteners are releasably coupled to the guide rods to secure the module to the chassis by preventing the modules from moving in a direction opposite the loading direction relative to the chassis. The fasteners may apply a clamp force in the loading direction on the housing of the module. In an embodiment, the guide rods are helically threaded, and the fasteners are internally-threaded nuts that can be threadably coupled to the guide rods. The fasteners may also include washers that are sandwiched between the nuts and the engagement surface of the housing. The nuts and washers may exert the clamp force by torqueing the nuts to axially move the nuts towards the back wall relative to the guide rods. Optionally, the fasteners may also be used in the mounting process to assist in moving the module from the position shown in FIG. 15 to a fully loaded position in which the module abuts against the back wall. In other embodiments, the fasteners may include or represent one or more of clips, posts, clamps, or the like.

Figure 16:
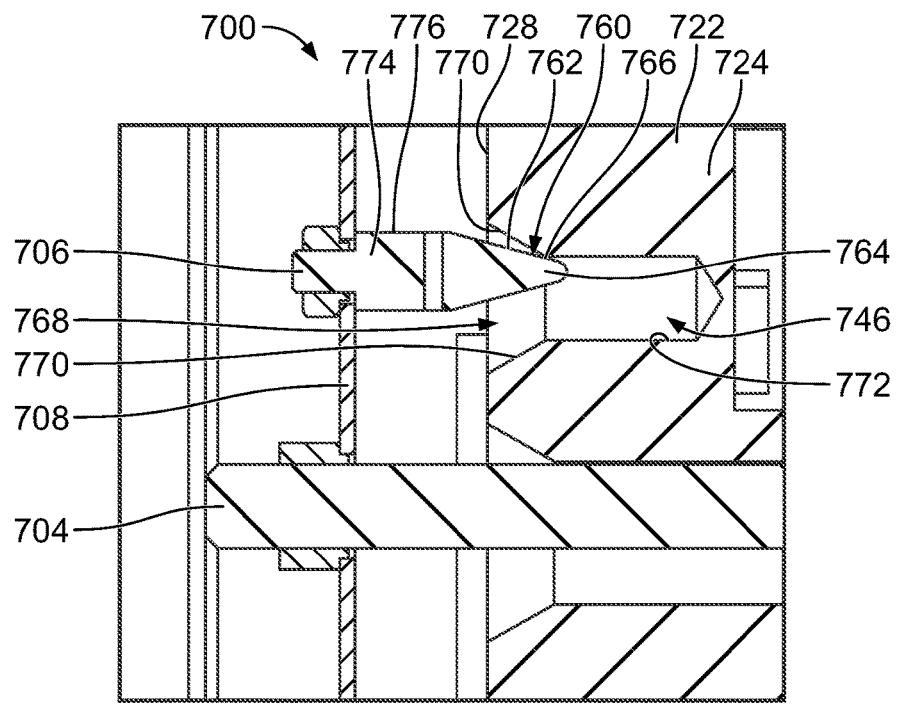
FIG. 16 is an enlarged cross-sectional view of a portion of the mounting system shown in FIG. 15.

FIG. 16 is an enlarged cross-sectional view of a portion of the mounting system 700 shown in FIG. 15. Although the following description specifically identifies and describes the elements shown in FIG. 16, the description may apply to similar elements not visible in FIG. 16. For example, FIG. 16 may show one guide rod 704 and one pin 706 disposed within the same vertical column interacting with the module 722, the description may also apply to the associated guide rod and the associated pin in the other vertical column (as shown in FIG. 13). As the module approaches the back wall 708, the pin 706 engages the module to define an angled contact interface 760 between the pin and the module. The contact interfaces are configured to mate with reciprocal electrical interfaces of the rack, for example. The angled contact interface passively lifts the module off the support platforms 710 (shown in FIG. 15) responsive to additional movement of the module in the loading direction. For example, the angled contact interface is sloped or ramped transverse to the plane of the support platforms. The angled contact interface converts lateral movement of the module in the loading direction (parallel to the plane of the support platforms) into vertical movement of the module away from the support platforms.

One or both of the pin and the housing 724 of the module define ramp surfaces that represent portions of the angled contact interface. For example, in the illustrated embodiment, the pin has a ramp surface 762 that defines at least a portion of the angled contact interface. The ramp surface is defined along a tapered distal end segment 764 of the pin. The tapered distal end segment 764 may have a conical shape. A contact surface 766 within the receptacle 746 of the module slides along the ramp surface as the module moves relative to the pin. The angle of the ramp surface converts the lateral movement of the module into vertical movement away from the support platforms.

A rear opening 768 of the receptacle at the rear side 728 of the housing may be countersunk to provide an expanded lead-in area to prohibit stubbing on the pin. In the illustrated embodiment, the countersunk portion 770 has a sloped angle that is greater than the angle of the ramp surface. As a result, the module is not lifted by the pin until the ramp surface of the pin engages an inside edge of the module that separates the countersunk portion from a main portion 772 of the receptacle. The inside edge represents the contact surface 766 of the module in the angled contact interface. For example, as the module moves in the loading direction, the inside edge contacts and slides along the ramp surface of the pin.

In an alternative embodiment, the sloped surface along the countersunk portion 770 may represent the contact surface in addition to the inside edge. For example, the ramp surface of the pin may contact and slide along the sloped surface of the countersunk portion to provide the lift. In another alternative embodiment, the receptacle of the module does not define a countersunk portion, and a top surface of the receptacle at the rear opening represents the contact surface that engages the ramp surface of the pin. In yet another alternative embodiment, the pin does not have the ramp surface, and the angled contact interface is provided by the sloped surface of the countersunk portion of the receptacle. For example, an edge of the pin may engage and slide along the sloped surface of the countersunk portion as the pin is received within the receptacle to lift the module.

In the illustrated embodiment, the pin has an intermediate section 774 disposed axially between the back wall and the tapered distal end segment. A surface 776 of the intermediate section (e.g., an intermediate surface) is between the ramp surface and the back wall. The intermediate surface has a uniform height (or distance) above the support platforms along the length of the intermediate segment. For example, the intermediate section may be a cylindrical portion that has a central axis parallel to the plane of the support platforms, and the intermediate surface is an exterior surface of the cylinder facing away from the support platforms. When the contact surface of the module engages and slides along the ramp surface, the ramp surface causes the module to gradually vertically rise away from the support platforms with additional movement in the loading direction. Once the contact surface of the module moves beyond the ramp surface, the contact surface engages and moves along the intermediate surface. Because the intermediate surface is parallel to the support platforms, the rear end of the module may remain at a constant height above the support platforms as the contact surface slides along the intermediate surface.

Therefore, according to at least one embodiment, the mounting system is designed such that the module being loaded laterally moves parallel to the support platforms during an initial loading stage in which the module is supported by the support platforms. Then, the module gradually rises upward off the support platforms during a secondary loading stage in which the module moves both laterally and vertically. Finally, before engaging the back wall of the chassis, the module once again laterally moves parallel to the support platforms due to the intermediate surface. In an alternative embodiment, the pin does not have the intermediate section, and the ramp surface extends fully to the back wall or to a rear end of the pin.

Figure 17:
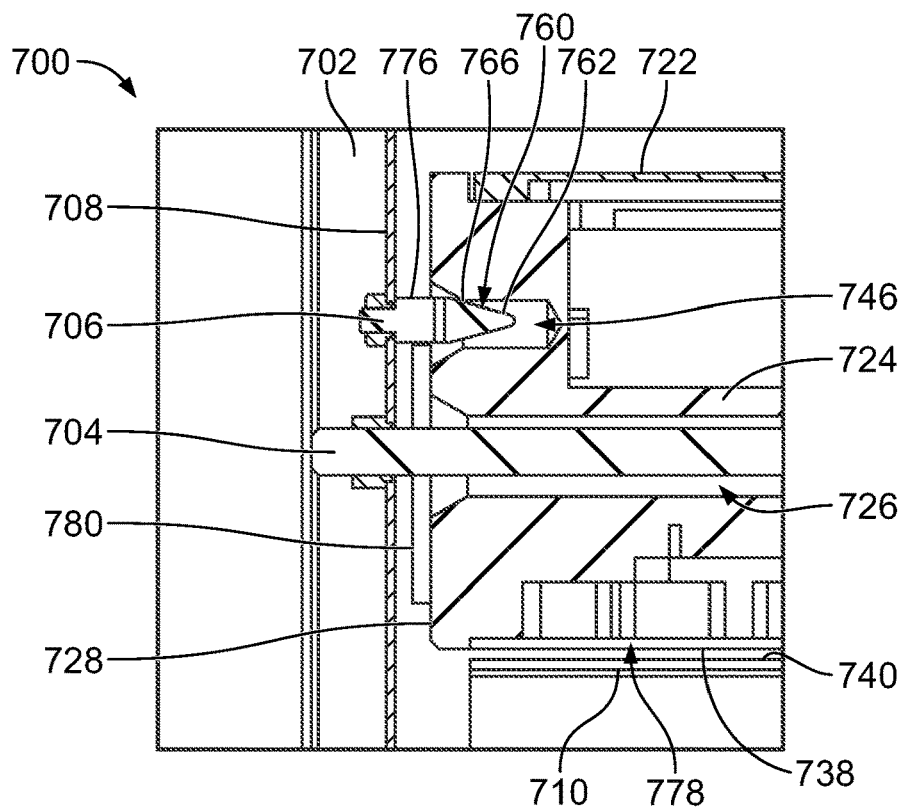
FIG. 17 is an enlarged cross-sectional view of the portion of the mounting system shown in FIGS. 15 and 16 showing the module during a secondary loading stage in which the module moves both laterally and vertically relative to the chassis.

FIG. 17 is an enlarged cross-sectional view of the portion of the mounting system 700 shown in FIGS. 15 and 16 showing the module 722 during a secondary loading stage in which the module moves both laterally and vertically relative to the chassis 702. In the illustrated position, the contact surface 766 of the module within the receptacle 746 engages the ramp surface 762 of the pin 706 proximate to the intermediate surface 776. Due to the angled contact interface 760 between the contact surface of the module and the ramp surface of the pin as the module is moved in the loading direction towards the back wall 708, the module is lifted by the pin off the support platforms 710. In the illustrated embodiment, the bottom side 738 of the module is spaced apart from the top surface 740 of the support platforms by a gap 778 (e.g., a clearance gap). The gap indicates that the module is not supported by the support platforms in the illustrated position of the module. Additional evidence of the vertical movement of the module relative to the chassis is that the guide rod 704 is disposed lower in the channel 726 in FIG. 17 relative to the pre-lifted position shown in FIG. 16. For example, the guide rod 704 is centered within the channel in FIG. 17, but is off-center and near a top region of the channel in FIG. 16.

In an embodiment, the module may include a gasket 780 mounted to the rear side 728 of the housing 724. The gasket 780 may be the plenum gasket 338 shown in FIG. 5. The gasket is compressible and may be composed of an elastic material, such as silicone, neoprene, rubber (e.g., natural or synthetic), and/or the like. The gasket can be compressed between the rear side of the module and the back wall when the module is in a fully loaded position relative to the chassis. Tin the compressed state, the gasket may dampen vibrations. The gasket is spaced apart from the back wall in FIG. 17. For example, to prevent damage and stress on the gasket due to shearing forces, the gasket may not engage the back wall while the module is moving vertically. The presence of the intermediate surface 776 ensures that the module only moves laterally (e.g., perpendicular to the plane of the back wall 708) when the gasket is in contact with the back wall.

Figure 18:
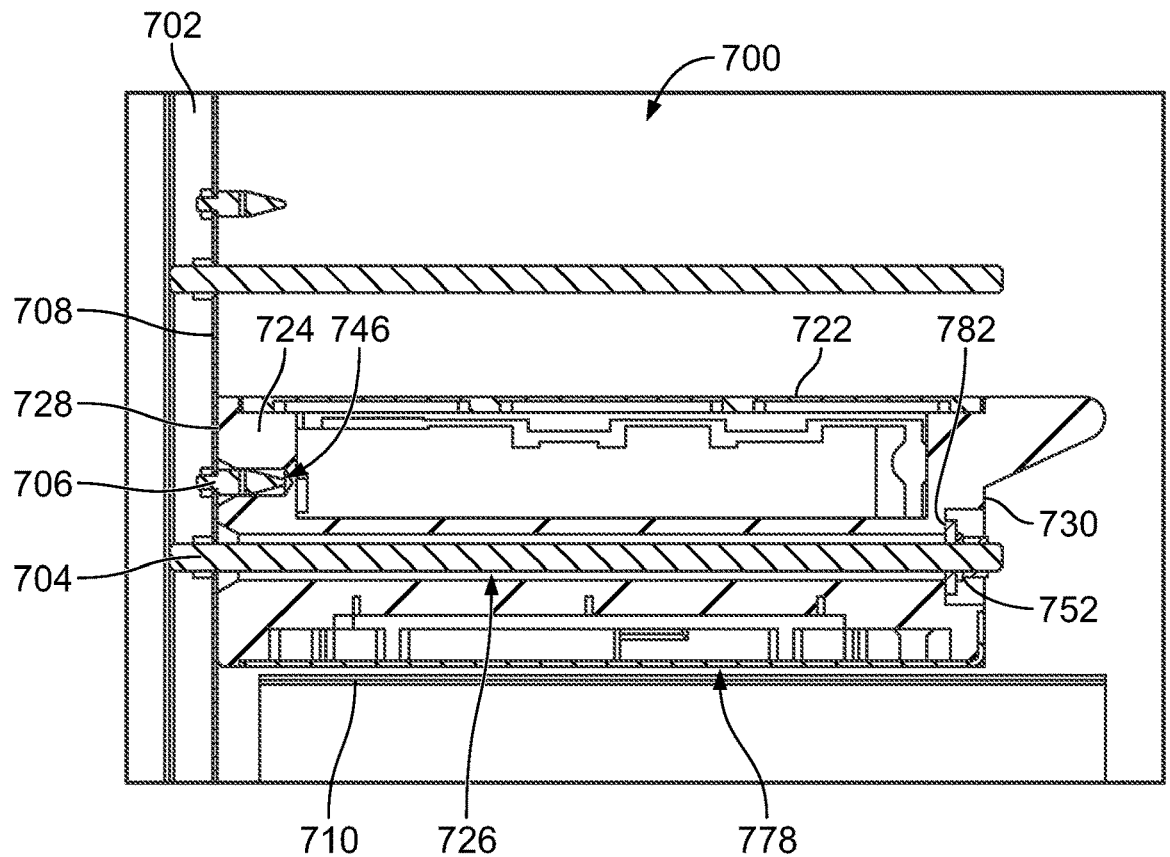
FIG. 18 is a cross-sectional view of the mounting system shown in FIGS. 15 through 17 showing the module in a fully loaded position relative to the chassis according to an embodiment.

FIG. 18 is a cross-sectional view of the mounting system 700 shown in FIGS. 15 through 17 showing the module 722 in a fully loaded position relative to the chassis 702 according to an embodiment. In the fully loaded position, the module abuts against the back wall 708 of the chassis. The gasket 780 shown in FIG. 17 is not visible in FIG. 18 due to the compression of the gasket between the rear side 728 of the module and the back wall. The module is fully separated from the support platforms 710 by the gap 778. In the illustrated embodiment, no portion of the module or the support platforms bridges the gap such that an entirety of the module is spaced apart from the support platforms. The weight of the module is supported by the back wall, the pins 706 in the receptacles 746, and/or the guide rods 704 in the channels 726.

The module may achieve the fully loaded position upon the module squaring up against the back wall such that the channel 726 is oriented approximately perpendicular (e.g., within a designated tolerance margin such as within 1°, 3°, or 5°) to the plane of the back wall. The module may be moved from the position shown in FIG. 17 to the fully loaded position shown in FIG. 18 by tightening the fastener 752 to exert a clamp force on the housing 724 in the loading direction that moves the module. In an embodiment in which the fastener is a threaded nut, the nut may be torqued to rotate the nut, causing the fastener to push a shoulder 782 of the housing at or proximate to the front side 730 towards the back wall. In reaction to the clamp force, the normal force exerted by the back wall in the direction opposite the loading direction may cause the module to square up against the back wall. In an alternative embodiment, the module may be moved to the fully loaded position by manually pushing the module in the loading direction until the module squares up against the back wall, and then tightening the fastener to secure the module in the fully loaded position. The full weight of the module may be supported by the combination of forces including the clamp force exerted by the fastener on the housing, the normal force exerted by the back wall on the housing, and the force exerted by the pins on the receptacles of the housing.

Figure 19:
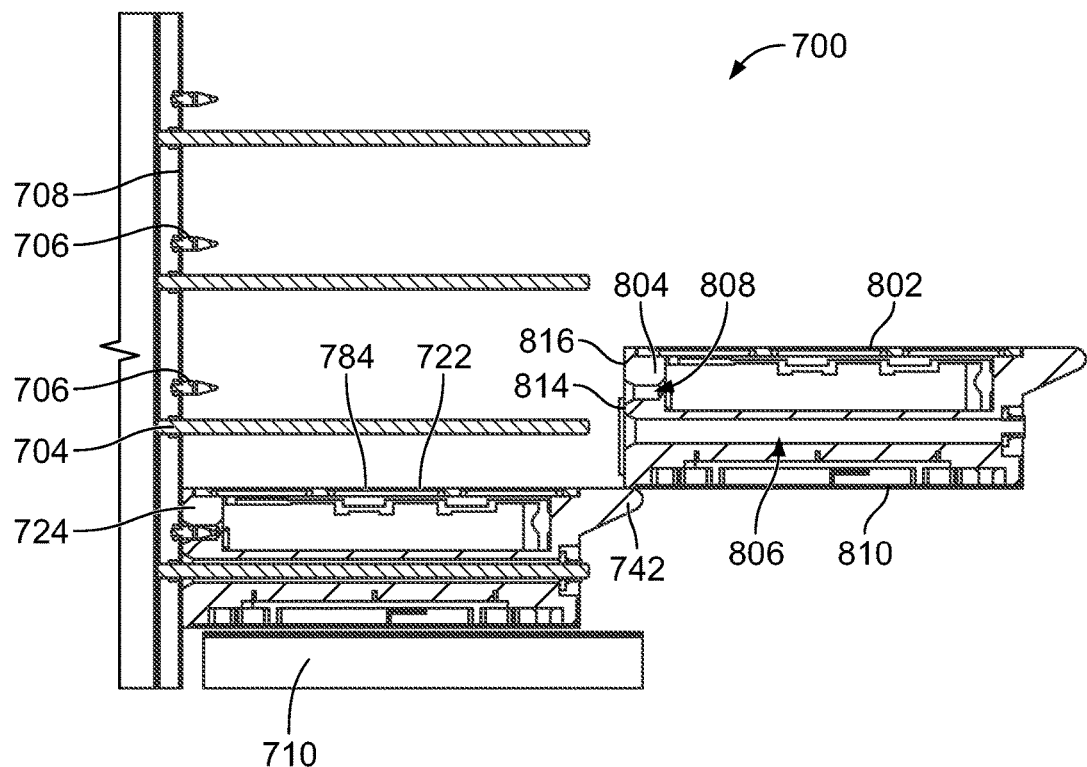
FIG. 19 is a side cross-sectional view of the mounting system showing the first module in the fully loaded position and a second module poised for mounting according to an embodiment.

FIG. 19 is a side cross-sectional view of the mounting system 700 showing the first module 722 in the fully loaded position and a second module 802 poised for mounting according to an embodiment. The second module 802 may represent the second-from-lowest module 204B in the stack 202 shown in FIGS. 2 and 10. The second module may include a housing 804 that may have the same or at least a similar form factor as the housing 724 of the first module 722. For example, the housing 804 defines two channels 806 that receive a corresponding pair of the guide rods 704 therein, and defines two receptacles 808 that receive a corresponding pair of the pins 706. The second module may also include a gasket 814 mounted on a rear side 816 of the housing, similar to the gasket 780 (shown in FIG. 17) on the first module. The second module 802 is disposed above the first module 722 in the stack such that the first module is between the second module and the support platforms 710.

During the initial stages of loading, the second module may be supported by the first module. For example, a bottom side 810 of the second module may be placed in physical contact on a top side 784 of the first module. The first module functions like the support platforms, as the first module may support an entirety or at least a majority of the weight of the second module. In the illustrated embodiment, the second module is supported on the shelf 742 of the first module. The shelf is coplanar with and/or defines an extension of the top side of the first module. The second module is then moved by an operator or a machine in the loading direction towards the back wall 708 such that the second module slides along the top side of the first module. The mounting of the second module is similar to the mounting of the first module. For example, once the pins engage the second module at an angled contact interface, the second module begins to lift off the first module with additional movement of the second module in the loading direction.

Figure 20:
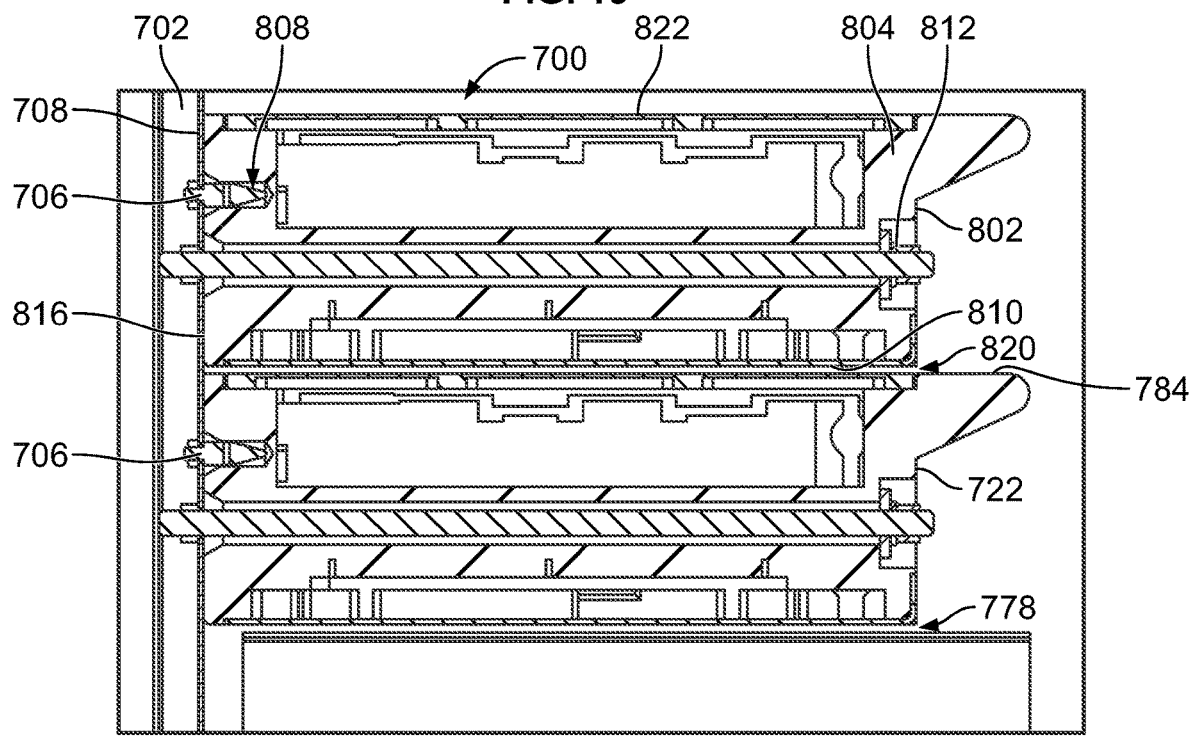
FIG. 20 is a cross-sectional view of the mounting system showing both the first and second modules in the fully loaded position relative to the chassis according to an embodiment.

FIG. 20 is a cross-sectional view of the mounting system 700 showing both the first and second modules 722, 802 in the fully loaded position relative to the chassis 702 according to an embodiment. When the second module achieves the fully loaded position against the back wall 708, the second module may be secured in the fully loaded position via a fastener 812. As shown in FIG. 20, the second module in the fully loaded position is supported by the pins 706 in the receptacles 808, the clamp force exerted on the housing 804 by the fastener 812, and/or the normal force exerted by the back wall on the rear side 816 of the housing. The gasket 814 may be compressed between the back wall and the rear side to provide vibration dampening. The second module is spaced apart from the first module below by a gap 820 defined between the bottom side 810 of the second module and the top side 784 of the first module. Optionally, none of the weight of the second module is supported by the first module when the second module is mounted to the chassis in the fully loaded position.

Additional modules of the module stack may be mounted to the chassis in the same way as the second module 802. For example, a third module immediately above the second module (e.g., the module 204C shown in FIGS. 2 and 10) may be loaded by sliding the third module along a top side 822 of the second module in the loading direction until the third module is lifted off the second module by the engagement with the pins 706 in the third-from-lowest pair on the chassis. In this way, the module stack is assembled one by one from the bottom up.

Figure 21:
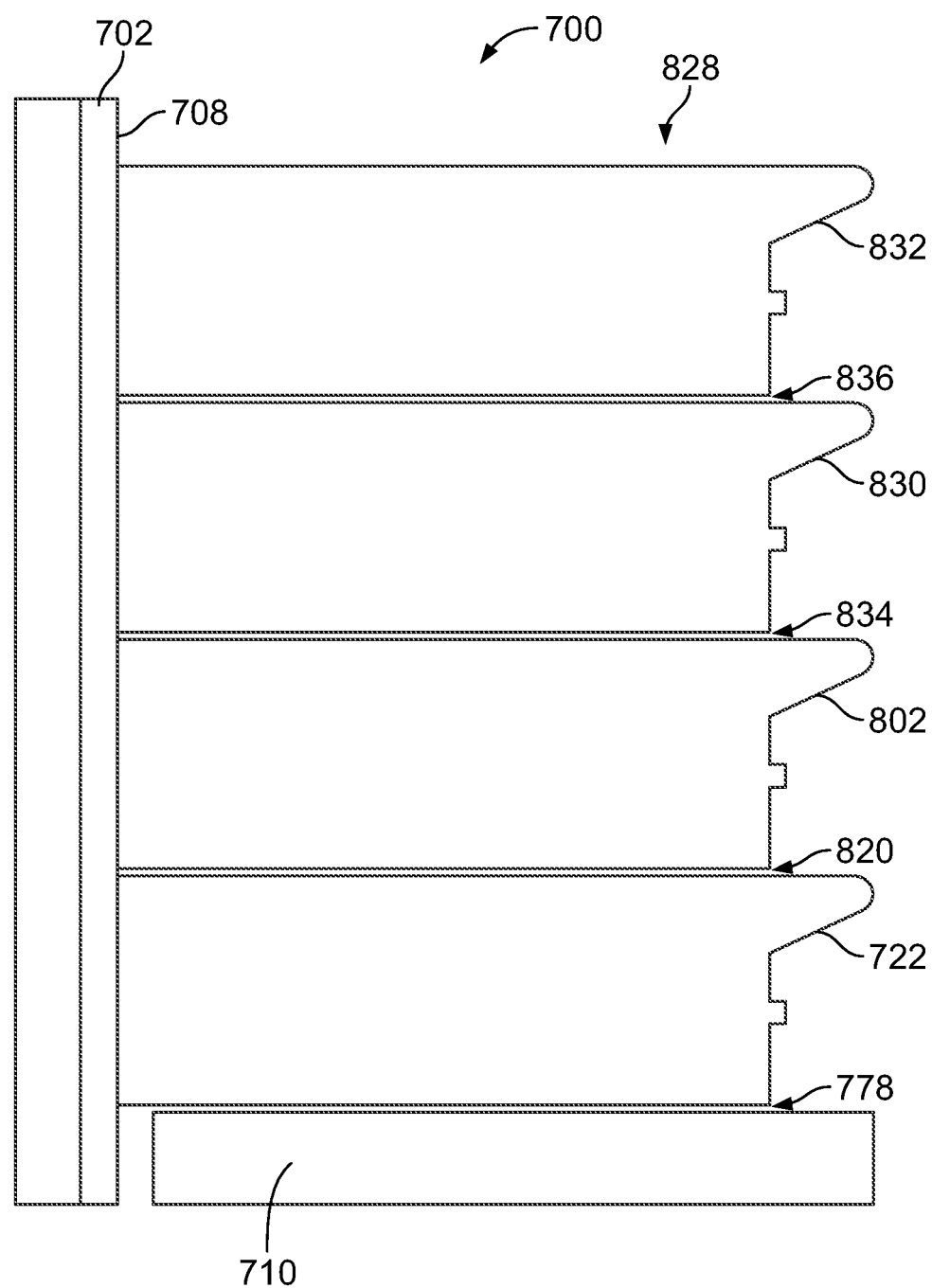
FIG. 21 is a side view of the mounting system showing four modules mounted to the chassis in a module stack according to an embodiment.

FIG. 21 is a side view of the mounting system 700 showing four modules mounted to the chassis 702 in a module stack 828 according to an embodiment. The four modules include the first module 722, the second module 802, a third module 830 above the second module, and a fourth module 832 above the third module 830. The fourth module is the uppermost module in the stack. All four modules are mounted in the fully loaded position relative to the chassis. In an embodiment, when the module stack is fully assembled as shown in FIG. 21, each of the modules is spaced apart from the adjacent modules in the stack (and from the support platforms 710) via clearance gaps. For example, the first module is separated from the support platforms 710 by the gap 778 and is separated from the second module above by the gap 820. The third module is separated from the second module below by a gap 834 and from the fourth module above by a gap 836.

The side view shown in FIG. 21 illustrates several aspects of the mounting system 700. For example, the clearance gaps between the modules provide electrical, mechanical, and thermal isolation between the modules. The modules may have internal electrical components that generate heat. The clearance gaps allow cooling fluid to flow between the modules enabling the cooling fluid, such as air, a liquid, or another type of gas, to absorb and dissipate heat from the system. The gaps are also useful to prevent or at least restrict the spread of thermal energy between the modules. For example, if one of the modules experiences fire and/or thermal runaway, the gaps may restrict the spread of the fire and/or thermal runaway to adjacent modules, which may reduce the total amount of damage and loss caused by the fire and/or thermal runaway. The gaps may also enable the presence of air or another dielectric material that electrically insulates the modules from one another. The electrical insulation may reduce the influence of electromagnetic interference across the modules, which may improve the performance of the internal electronic components of the modules. The mechanical isolation provided by the clearance gaps enables individually and independently unloading any of the modules in the stack with a similar and limited amount of effort. For example, if the first module 722 is suspected to be malfunctioning, an operator can remove the first module 722 from the stack to perform maintenance without removing the three modules above. Without the clearance gaps above the first module, the weight of the three modules above may be exerted on the top of the first module. In such a design that lacks the gaps, all three of the modules above may have to be removed from the stack to access the desired first module.

The sizes of the gaps between the modules may be selected and/or customized to provide a desired amount of thermal and/or electrical isolation between the modules. For example, the height of the gaps may be increased to provide additional electrical isolation between the modules. In another example, the height of the gaps may be increased if there is a significant risk of fire to reduce the likelihood of secondary damage to other modules in the stack. The gaps all have the same sizes as one another in the illustrated embodiment, but at least some of the gaps may have different sizes from one another in an alternative embodiment. For example, if the fourth module 832 has a greater risk of fire, is a greater producer of electromagnetic interference, and/or is more sensitive to electromagnetic interference than one or more of the other modules in the stack, the gap 836 between the fourth module 832 and the third module 830 may be sized greater than the gaps between the other modules to provide increased isolation. The size of the gaps may be controlled by the positioning of the lifting elements (e.g., pins) and guide rods on the back wall 708.

Optionally, after mounting the modules to the chassis, one or more inserts may be installed into the gaps. The inserts may include or represent vibration-dampening inserts to reduce relative movement between the modules, cooling inserts to provide active and/or passive cooling, fire suppression inserts, and/or the like. The inserts may have various forms, including pads, foam, sheets, or the like. Optionally, the inserts may occupy only a portion of the gaps to maintain passageways for air and/or the like. Vibration dampening may also be achieved by gaskets mounted between the back wall and the rear sides of the modules (e.g., the gaskets 780, 814) and/or the rigid support member 512 shown in FIG. 10 that mechanically couples the modules together at or near the front ends of the modules.

In an alternative embodiment, instead of sliding each of the modules on the support platform or module below while loading and unloading the module, the modules may be outfitted with rolling elements along the respective top sides or bottom sides thereof. The rolling elements may include wheels, cylindrical rollers, or the like. The presence of the rolling elements may reduce the resistance caused by friction while loading and unloading the modules. In an embodiment, even with the rolling elements, the modules completely lift off the support platform and/or module below upon achieving the fully loaded position. The lift defines the clearance gaps. For example, the angled contact interface may cause the modules to lift to such an extent that the rolling elements separate from the contacting surface.

Figure 22:
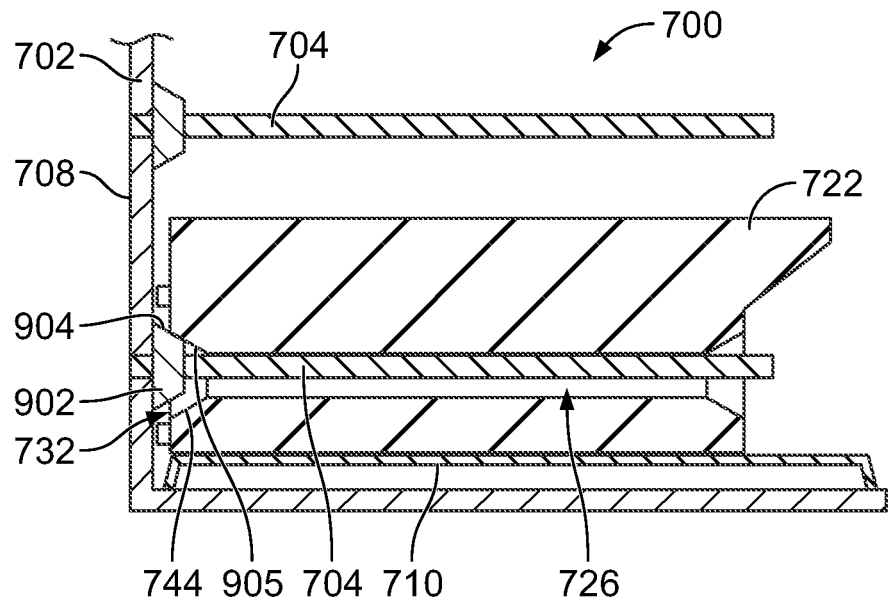
FIG. 22 is a cross-sectional view of the mounting system according to a first alternative embodiment showing a first intermediate loading stage of the first module.

FIG. 22 is a cross-sectional view of the mounting system 700 according to a first alternative embodiment showing a first intermediate loading stage of the first module 722. The first module is supported by the support platforms 710. In the illustrated embodiment, the lifting elements of the chassis 702 are mounted on the guide rods 704 instead of being spaced apart from the guide rods and mounted directly to the back wall 708. For example, the lifting elements may be washers 902 that have a conical shape. The conical washers may annularly surround the guide rods. The conical washers are located at least proximate to the back wall, and optionally may be disposed in contact with the back wall. The exterior surfaces of the washer are sloped to define a ramp surface 904 that represents a portion of an angled contact interface that lifts the module off the support platform. For example, as the module is moved in the loading direction towards the back wall, the conical washer eventually engages a sloped contact surface 905 along the lead-in section 744 of the channel 726 (at the rear opening 732). The ramp surface 904 of the conical washer and the contact surface 905 of the lead-in section may have complementary angles and may define the angled contact interface.

Figure 23:
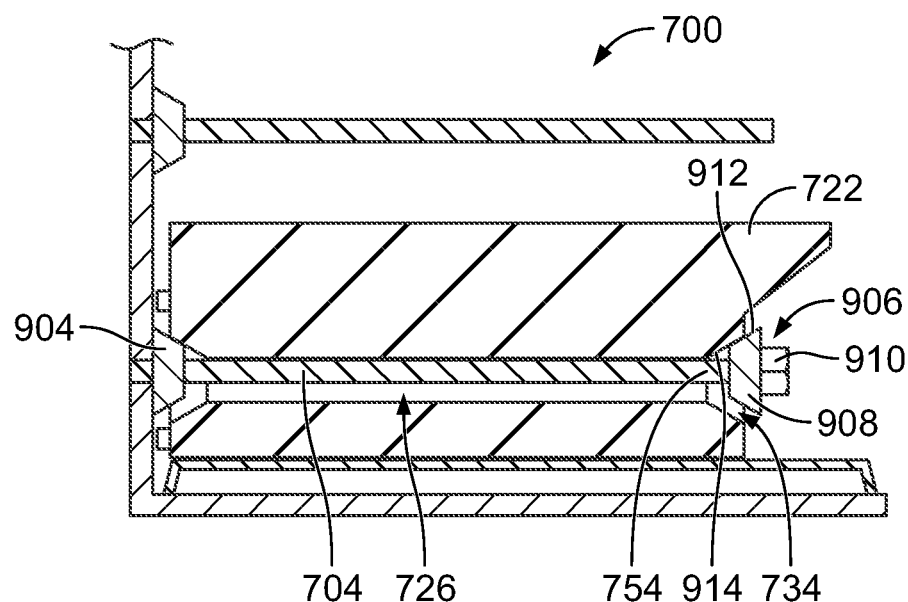
FIG. 23 is a cross-sectional view of the mounting system according to the alternative embodiment shown in FIG. 22 showing a second intermediate loading stage of the first module.

FIG. 23 is a cross-sectional view of the mounting system 700 according to the alternative embodiment shown in FIG. 22 showing a second intermediate loading stage of the first module 722. In the illustrated embodiment, a fastener 906 is installed on the distal end segment 754 of the guide rod 704 before the module is moved to the fully loaded position. The fastener 906 in the illustrated embodiment is a set including a conical washer 908 and a threaded nut 910. The conical washer 908 may be a replica or copy of the conical washer 904. The conical washer 904 proximate to the back wall may be referred to as a rear lifting element or rear conical washer, and the conical washer 908 engaging the nut 910 may be referred to as a front lifting element or front conical washer. The front conical washer may mirror the rear conical washer. The front conical washer is axially disposed between the nut and the rear conical washer. Although shown as two discrete elements, the fastener in an alternative embodiment may be a unitary, one-piece, monolithic component that combines the functionality of the conical washer and the threaded nut, such as a threaded conical nut. A ramp surface 912 of the front conical washer may engage a sloped contact surface 914 at the front opening 734 of the channel 726. In an embodiment, the module is moved from the position shown in FIGS. 22 and 23 to the fully loaded position by using the fastener 906 to exert a clamp force on the module.

Figure 24:
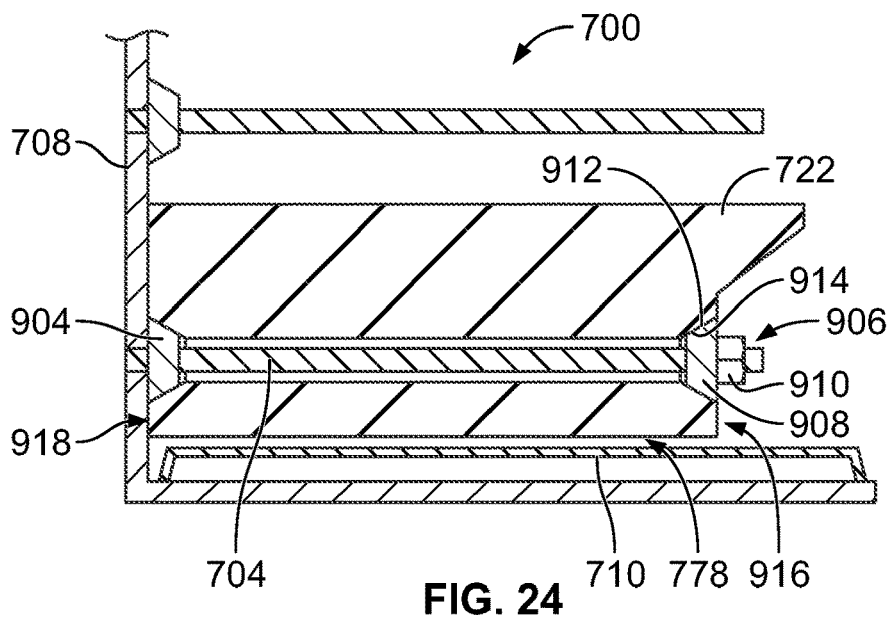
FIG. 24 is a cross-sectional view of the mounting system according to the alternative embodiment shown in FIGS. 22 and 23 showing the first module at the fully loaded position.

FIG. 24 is a cross-sectional view of the mounting system 700 according to the alternative embodiment shown in FIGS. 22 and 23 showing the first module 722 at the fully loaded position. Applying a torque on the nut 910 rotates the nut and moves both the nut and the front conical washer 908 towards the back wall 708 relative to the guide rod 704. As a consequence, the ramp surface 912 of the front conical washer wedges under the contact surface 914 of the module which causes the module to move further in the loading direction and also assists with lifting a front end 916 of the module off the support platforms 710. For example, the clamp force exerted by the fastener 906 on the module and the resulting normal force exerted by the back wall on the rear side of the module may provide a majority of the lift of the front end of the module. The additional movement of the module in the loading direction causes the rear conical washer 904 to lift a rear end 918 of the module off the support platform. The end result is the formation of the clearance gap 778 between the module and the support platform. The conical washers optionally may include a compressible material, such as a rubberized coating, that provides vibration dampening. The additional modules above the first module are mounted in a similar fashion as the first module.

In another alternative embodiment, the lifting elements of the mounting system may include both the pins shown in FIGS. 13 through 20 and the front conical washers shown in FIGS. 22 through 24. For example, the fasteners 752 shown in FIG. 15 may include a conical washer similar to the front conical washer 908.

Figure 25:
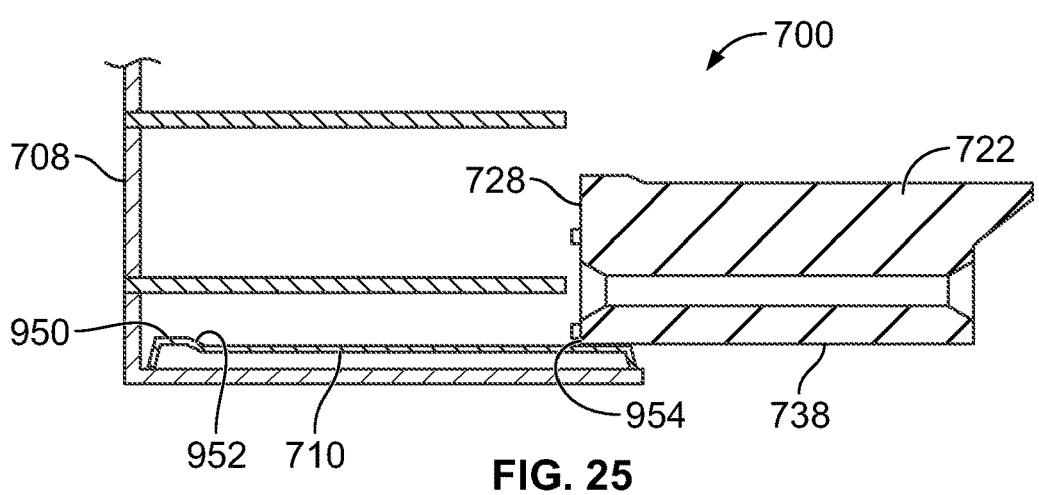
FIG. 25 is a cross-sectional view of the mounting system according to a second alternative embodiment showing an intermediate loading stage of the first module.
Figure 26:
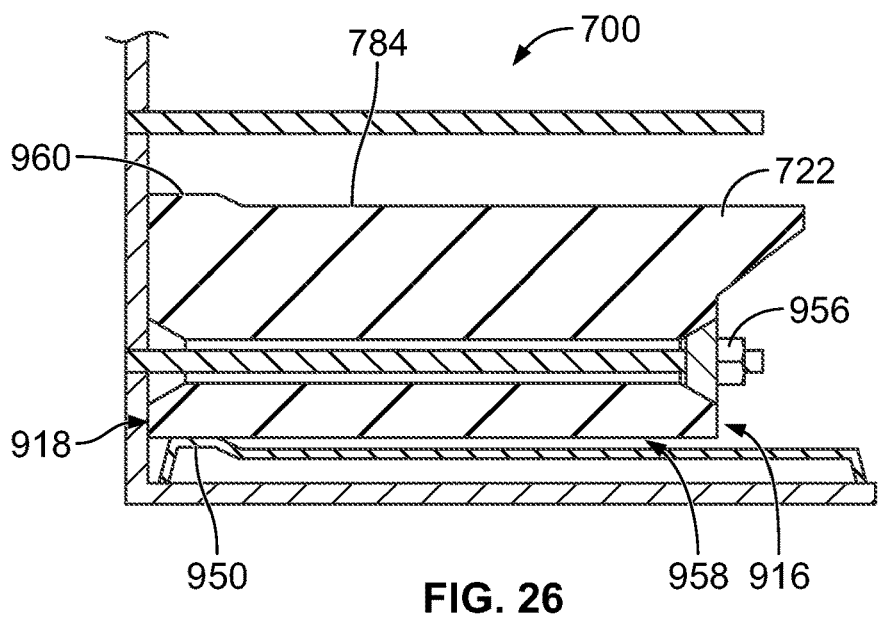
FIG. 26 is a cross-sectional view of the mounting system according to the alternative embodiment shown in FIG. 25 showing the first module at the fully loaded position.

FIG. 25 is a cross-sectional view of the mounting system 700 according to a second alternative embodiment showing an intermediate loading stage of the first module 722. The first module is supported by the support platforms 710 in the illustrated intermediate loading stage. FIG. 26 is a cross-sectional view of the mounting system 700 according to the alternative embodiment shown in FIG. 25 showing the first module 722 at the fully loaded position. In the illustrated embodiment, the lifting elements are wedge members. For example, the support platforms 710 include respective wedge members 950 (only one of which is visible in the illustrated cross-section). The wedge member 950 is disposed at least proximate to the back wall 708. For example, the wedge member is spaced apart from the back wall in the illustrated embodiment, the wedge member optionally may contact the back wall. The wedge member may include a ramp surface 952 that is sloped transverse to the plane of the (remainder of the) support platform.

As shown in FIG. 25, the bottom side 738 of the module slides along the support platform as the module is moved in the loading direction towards the back wall. Eventually, a corner 954 of the module between the bottom side and the rear side 728 engages the ramp surface of the wedge member, which defines an angled contact interface between the lifting element and the module. Referring now to FIG. 26, additional movement of the module causes the wedge member to passively lift the module above the plane of the remainder of the support platform. A fastener 956 is coupled to the guide rod 704 to provide a clamp force that secures the module in sustained engagement with the back wall, allowing the front end 916 of the module to be suspended above the support platforms to define a clearance gap 958. Although the rear end 918 of the module remains in contact with the support platform via the wedge member, a majority of the bottom side of the module is spaced apart from the support platform to enable the formation of the gap.

In the illustrated embodiment, the first module may include a wedge member 960 that projects beyond the top side 784. The wedge member of the first module may have the same configuration or at least a similar configuration (e.g., size and shape) as the wedge member 950 of the support platform. The wedge member of the first module passively lifts the second module 802 off the top side of the first module when the second module is being loaded in the module stack.

Figure 27:
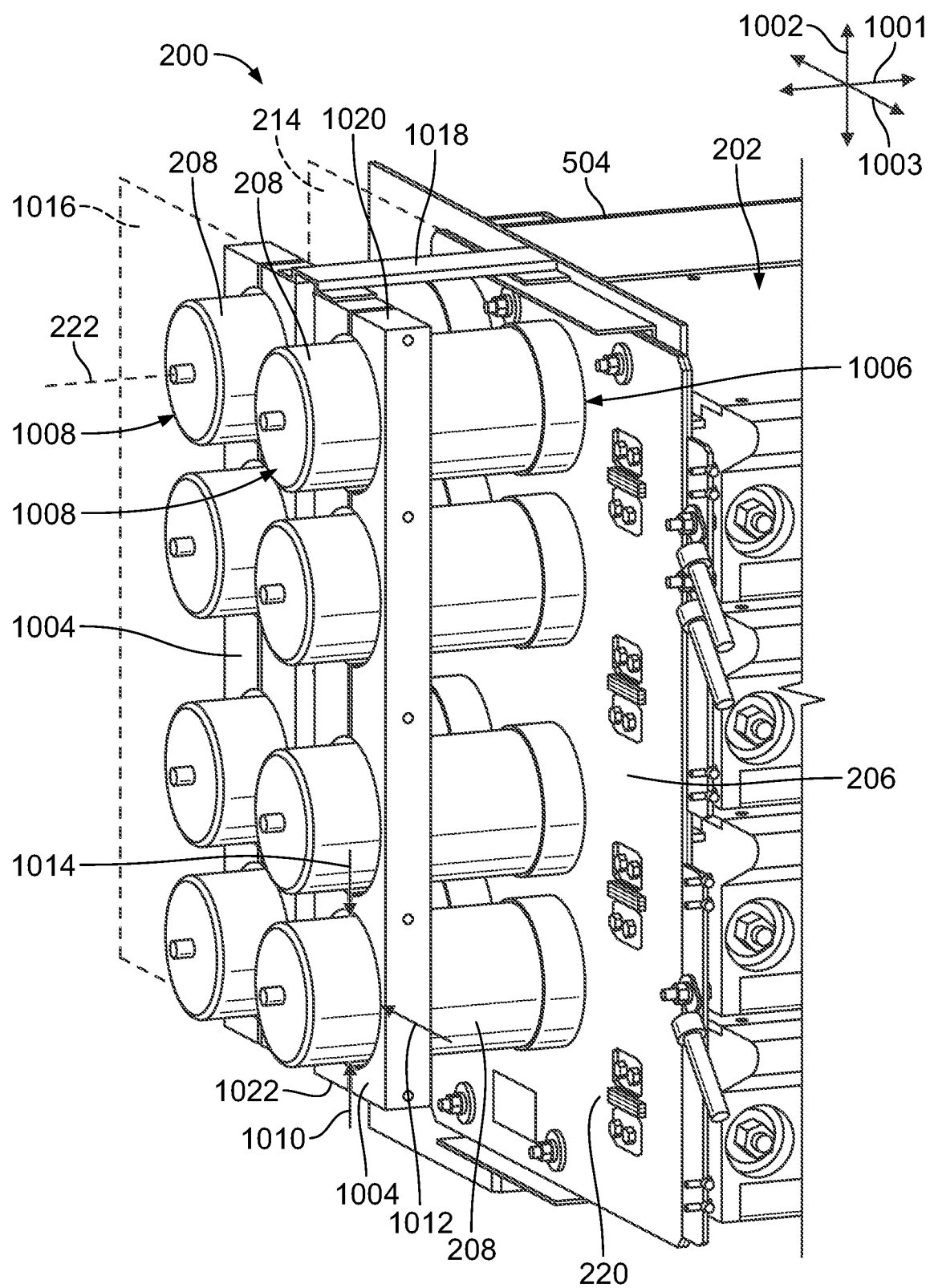
FIG. 27 is a perspective view of a portion of the electrical power delivery system shown in FIG. 2.

FIG. 27 is a perspective view of a portion of the electrical power delivery system 200 shown in FIG. 2. The illustrated portion of the electrical power delivery system shows the electrical energy storage devices 208, which are capacitors in the illustrated embodiment. The electrical power delivery system is oriented with respect to a lateral axis 1001, a height axis 1002, and a longitudinal axis 1003. The axes 1001-1003 are mutually perpendicular. The axes 1001-1003 are not required to have any particular orientation with respect to gravity, although in at least one embodiment the height axis 1002 extends in a vertical direction parallel to the force of gravity.

The capacitors are mechanically and electrically connected to the conductive bus bar (or conductive plane) 206, and commonly project from the second side 220 of the bus bar facing away from the module stack 202. The capacitors may be cylindrical and extend along respective central axes 222 from a respective connection end 1006 to a respective distal end 1008 opposite the connection end 1006. The connection ends are disposed at the bus bar and are electrically and mechanically connected thereto. The distal ends are spaced apart from the bus bar. Thus, the capacitors are cantilevered from the bus bar. As described above, the central axes of the capacitors may be perpendicular to the plane 214 of the bus bar. The plane 214 may be oriented parallel to the height axis 1002. The capacitors may project laterally from the bus bar, such that the central axes 222 are parallel to the lateral axis 1001.

In one or more embodiments, the electrical power delivery system may include at least one support structure 1004 that supports portions of the capacitors and/or other electrical energy storage devices that are spaced apart from the conductive bus bar. The support structures are spaced apart from the conductive bus bar. The support structures may engage portions of the capacitors that are disposed between the connections ends and the distal ends to provide structural support for the capacitors. The support structures engage and at least partially surround each of the capacitors in the array. In the illustrated embodiment, the electrical power delivery system may include two support structures. Each of the support structures engages and at least partially surrounds the four capacitors in a different column of two adjacent columns of the capacitors. In an alternative embodiment, the electrical power delivery system may have a different number of support structures than the two shown in FIG. 27.

The support structures can support a load to reduce forces exerted at the connection ends of the capacitors where the capacitors are connected to the bus bar. For example, the load supported by the support structures may include a portion of the weight of the capacitors. In a non-limiting example, the capacitors may each weight at least five pounds, such as ten pounds, so the structural support provided by the support structures at locations spaced apart from the bus bar significantly reduce (or eliminate) the torsional forces exerted at the connection ends due to the length and weight of the capacitors. The load supported by the support structures may also include forces attributable to travel of a vehicle in which the electrical power delivery system is disposed. For example, during movement and other operation of the vehicle, vibrations, accelerations, and impact forces (e.g., from uneven terrain, etc.) may be exerted on the electrical power delivery system. The support structures can prohibit or at least limit movement of the capacitors relative to the bus bar and the other components of the electrical power delivery system due to vibrations, accelerations, and/or impact forces during travel of the vehicle. The support structures may also absorb and dissipate such forces to reduce the amount of force exerted on the capacitors, relative to the electrical energy storage devices being connected directly to the chassis. Reducing the magnitude of forces exerted on the capacitors may improve the operating performance and/or increase the operational lifetime of the capacitors because high forces can damage the capacitors or the connectors between the capacitors and the bus bar.

In one or more embodiments, the support structures mechanically support the corresponding capacitors along at least two support directions 1010, 1012 that are orthogonal to each other. For example, a first support direction 1010 shown in FIG. 27 points vertically upward parallel to the height axis 1002, to indicate that the support structure supports the weight of the capacitor (which is directed downward along the height axis 1002 due to the force of gravity). The second support direction 1012 shown in FIG. 27 points parallel to the longitudinal or depth axis 1003 and indicates that the support structure restricts movement of the capacitor along the longitudinal axis 1003 due to vibrations, accelerations, and/or impact forces. FIG. 27 also shows a third support direction 1014 that is parallel to and opposite the first support direction 1010 along the height axis 1002. Thus, the support structures restrict upward movement of the capacitors due to vibrations, accelerations, and/or impact forces. The third support direction 1014 is orthogonal to the second support direction 1012. Although not indicated in the illustrated embodiment, the support structures may also support the capacitors in a fourth support direction that is parallel to and opposite the second support direction 1012 along the longitudinal axis 1003 (and orthogonal to the first and third support directions 1010, 1014). Therefore, the structural supports support each of the capacitors in at least one vertical direction parallel to the height axis and in at least one longitudinal direction parallel to the longitudinal (or depth) axis (which is orthogonal to both the height axis and the lateral axis). The support directions 1010, 1012, 1014 provided by the support structures are within a common plane 1016. The plane 1016 is parallel to, and spaced apart from, the plane 214 of the bus bar. Optionally, the support structures support the capacitors in at least two orthogonal support directions within the plane 1016 that are not parallel to the axes 1001-1003 in addition to, or instead of, the support directions shown in FIG. 27.

The support structures may be secured to the chassis 504 of the electrical power delivery system, to the case 600 (shown in FIG. 11), or to another component on the vehicle. In the illustrated embodiment, the support structures are fixed to a beam (or arm) 1018 of the chassis. The beam may mechanically support the support structures relative to the chassis by rigidly tying the support structures to the chassis. When the electrical power delivery system is exposed to forces attributable to vibration, acceleration, and/or impacts, mechanically securing the support structures to the chassis reduces relative movement between the support structures (and the capacitors) and the chassis. In the illustrated embodiment, the beam is disposed above a top 1020 of the support structures, and the support structures may be coupled to the beam via fasteners, adhesives, and/or the like. The support structures may be separately secured to the chassis relative to the bus bar. For example, the support structures are mounted to the beam of the chassis at a location spaced apart from the bus bar. In an alternative embodiment, the support structures may be coupled to the chassis at one or more other locations, such as at a bottom 1022 of the support structures or along a side of the support structures in addition to the top or instead of the top.

Figure 28:
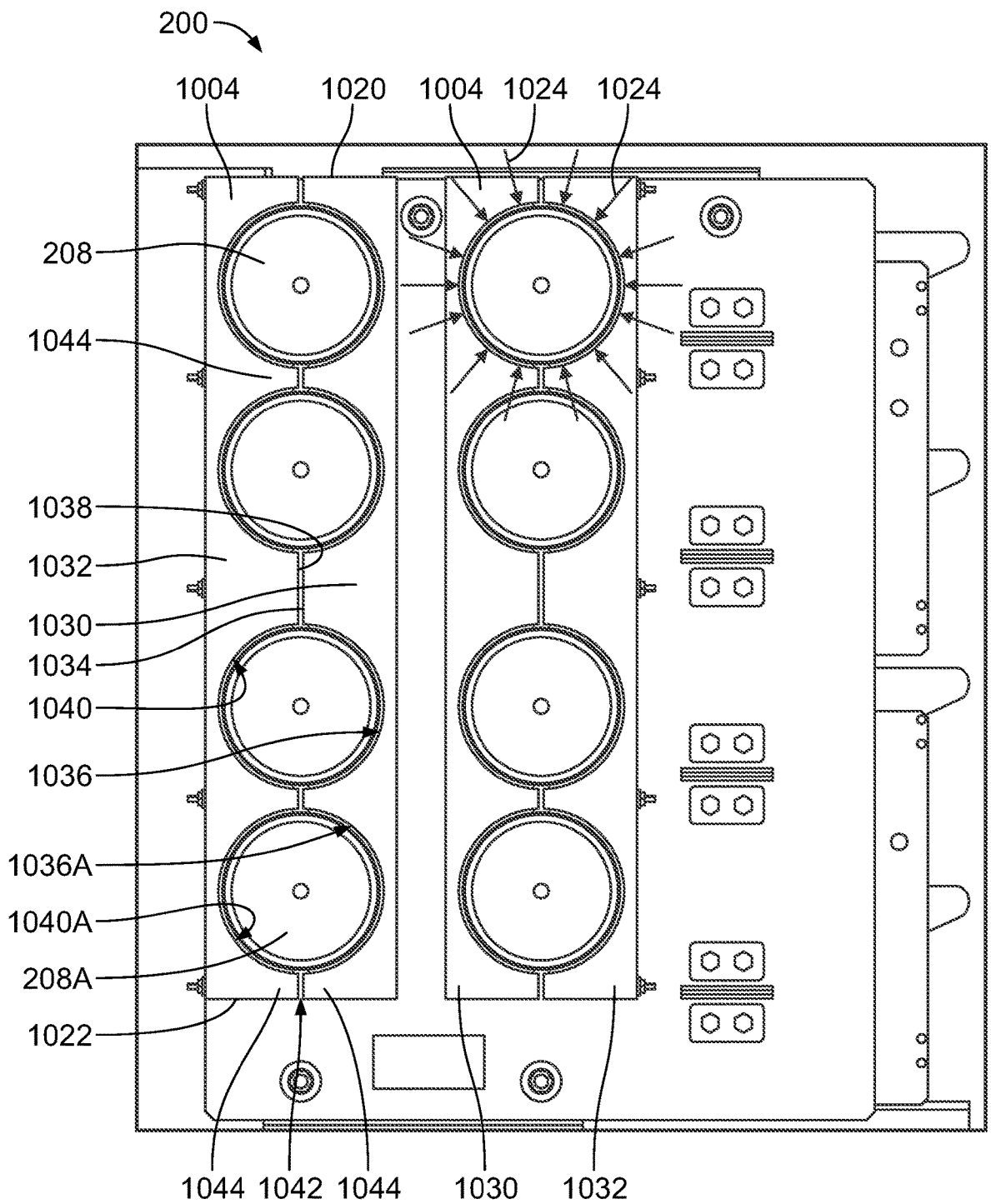
FIG. 28 is a side view of the electrical power delivery system showing two support structures according to the embodiment shown in FIG. 27.

FIG. 28 is a side view of the electrical power delivery system 200 showing the two support structures 1004 according to the embodiment shown in FIG. 27. In the illustrated embodiment, support structures surround at least a majority of the perimeter of each of the capacitors 208 to support the capacitors in numerous support directions. The capacitors may be cylindrical with circular perimeters or circumferences. The support structures in FIG. 28 surround each capacitor around almost the entire circumference thereof, if not the entire circumference, such that the support structures support the capacitors in a bevy of radially-extending support directions 1024. At least some of the radially-extending support directions 1024 are orthogonal to one another.

In the illustrated embodiment, each support structure is an assembly that may include a first shell member 1030 and a second shell member 1032 that couple together around the capacitors to support the capacitors. The design of the support structures may be referred to as a clamshell design. The first shell member 1030 has an inner side 1034 and defines multiple concave grooves 1036 along the inner side. The concave grooves are spaced apart along a height of the first shell member. Likewise, the second shell member 1032 of each support structure has an inner side 1038 and defines multiple concave grooves 1040 along the inner side that are spaced apart along the height of the second shell member.

The support structures are shown in assembled states in FIG. 28. In the assembled state, the inner sides 1034, 1038 of the first and second shell members face towards each other. The capacitors are received into corresponding concave grooves 1036, 1040 of the shell members. For example, a given capacitor 208A is received into one concave groove 1036A of the first shell member and one concave groove 1040A of the second shell member. The concave groove of the first shell member surrounds a first perimeter segment of the capacitor, and the concave groove of the second shell member surrounds a second perimeter segment of the capacitor. The second perimeter segment may be circumferentially spaced apart from the first perimeter segment such that there is no overlap between the first and second shell members. The concave grooves of the first and second shell members engage the outer surfaces of the capacitors to support the capacitors in the radially-extending support directions.

When the first shell member is coupled to the second shell member, a seam 1042 may be defined between the inner sides of the first and second shell members along portions 1044 of the shell members that border the concave grooves. For example, some portions 1044 are disposed between two concave grooves and other portions 1044 are disposed at the top 1020 and the bottom 1022 of the support structure. Optionally, the inner sides may be spaced apart at the seam to define a narrow gap between the two shell members. Alternatively, the inner sides of the shell members may abut against each other at the seam.

In the illustrated embodiment, each of the two support structures has a vertical orientation, such that the support structures are elongated parallel to each other and parallel to the height axis 1002 shown in FIG. 27. In an alternative embodiment, the support structures may have a different orientation, such as a longitudinal orientation parallel to the longitudinal axis 1003 in FIG. 27. The longitudinal orientation may be orthogonal to the vertical orientation that is shown. For example, the electrical power delivery system may include four longitudinally-extending support structures, with each support structure surrounding two capacitors, instead of the two vertically-extending support structures shown in the illustrated embodiment.

Figure 30:
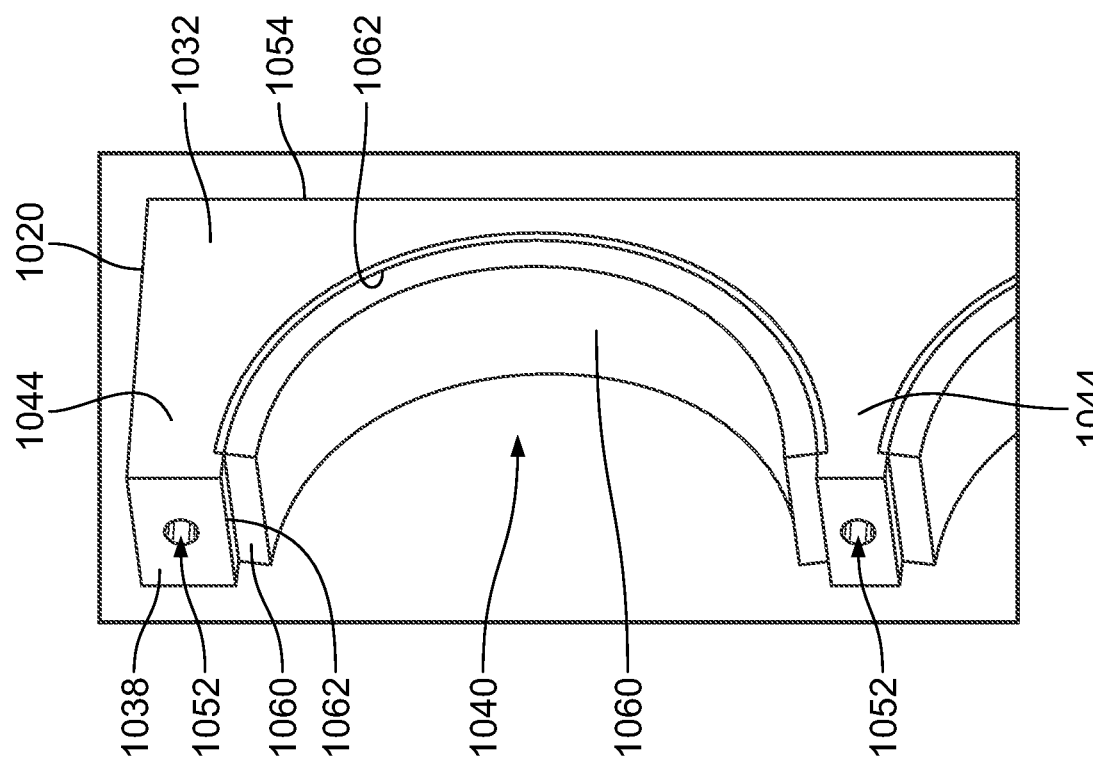
FIG. 30 is a perspective view of a portion of the second shell member of the support structure.
Figure 29:
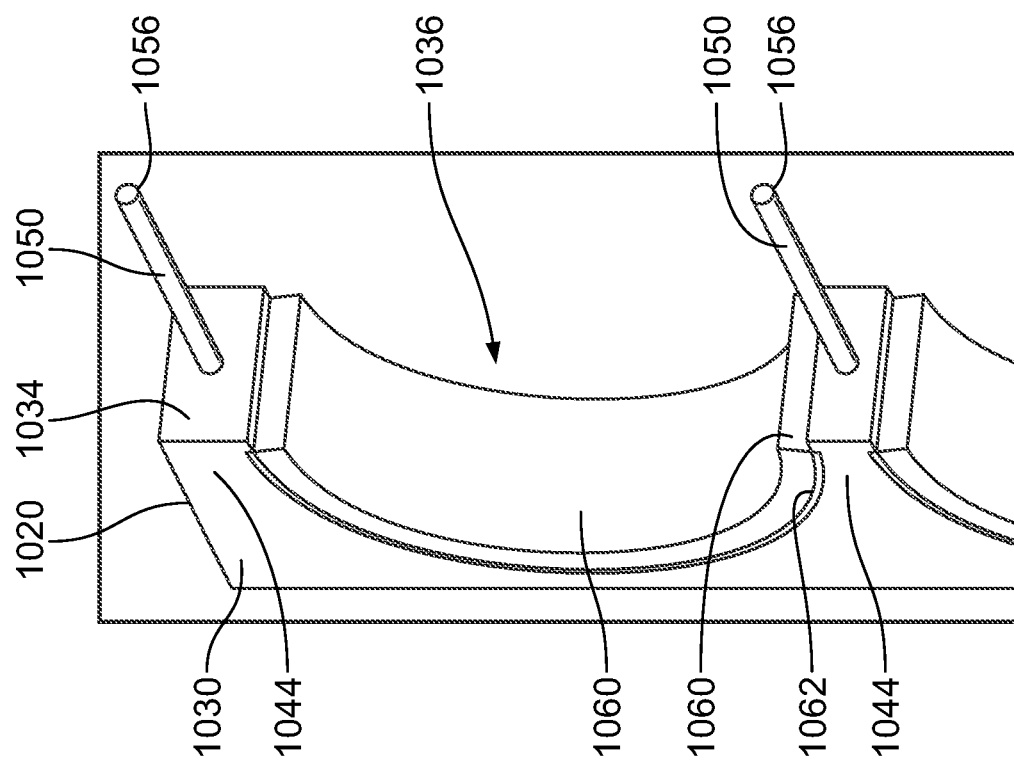
FIG. 29 is a perspective view of a portion of a first shell member of one of the support structures shown in FIGS. 27 and 28 according to an embodiment.

FIG. 29 is a perspective view of a portion of the first shell member 1030 of one of the support structures 1004 shown in FIGS. 27 and 28 according to an embodiment. FIG. 30 is a perspective view of a portion of the second shell member 1032 of the same support structure. The first and second shell members 1030, 1032 may represent portions of either of the two support structures that support the array of capacitors as shown in FIGS. 27 and 28. The illustrated portions of the first and second shell members 1030, 1032 depict an end of the support structure, such as the top 1020.

In an embodiment, the first shell member may include rods 1050 that project from the inner side 1034 thereof. For example, the rods are mounted to the first shell member at the portions 1044 of the first shell member that border the concave grooves 1036. The rods may be at least partially embedded within the material of the first shell member. For example, the first shell member may be at least partially composed of a composite material, a plastic material, and/or the like. The rods may be embedded within the material by securing an end of each rod into a hole in the material via an adhesive, an epoxy, or the like, or may be embedded in-situ during the formation of the first shell member, such as via a molding process or the like. The rods may include a metal material and a fastener. In one embodiment, the rods have helical threads that can receive a threaded nut or another threaded fastener. The rods project from the inner side with parallel orientations. Although two rods are shown in the illustrated portion of the first shell member, in other embodiments the entire first shell member may include more than two rods. The rods may be used for coupling the first shell member to the second shell member. Other fasteners, such as clips and quick connects may be used in other embodiments.

As shown in FIG. 30, the second shell member defines apertures 1052 along the inner side 1038 thereof. Each of the apertures is sized and shaped to receive a single rod of the first shell member therein to couple the first and second shells together. The diameters of the apertures may be slightly larger than the diameters of the rods to allow the rods to be received within the apertures without stubbing or otherwise restricting coupling, while also providing alignment and guidance during the coupling operation. For example, the engagement between the rods and the interior surfaces of the apertures may provide a track that guides the coupling between the two shell members as the two shell members move towards each other and towards the capacitors therebetween. The apertures are positioned to align with the rods, such that the apertures are located at the portions 1044 of the second shell member that border the concave grooves 1040. The apertures optionally extend fully through an entire width of the second shell member from the inner side 1038 to an outer side 1054 of the second shell member opposite the inner side. Optionally, the rods may project a distance from the first shell member than is greater than the weight of the second shell member such that a distal tip 1056 of each rod eventually exits the aperture and projects beyond the outer side of the second shell member when the shell members are coupled together.

In one or more embodiments, the first and second shell members include compressible liners 1060 within the respective concave grooves 1036, 1040. The compressible liners 1060 can engage outer surfaces of the capacitors when the shell members are coupled together. The compressible liners are affixed along respective curved inner surfaces 1062 of the shell members that define the concave grooves. The liners may be affixed to the inner surfaces via adhesives, fasteners, or the like. In an embodiment, the compressible liners include a different material than the bodies of the shell members. For example, the compressible liners may be less rigid and more flexible and compressible than the bodies of the shell members. Optionally, the liners may include or represent a foam or foam-like material, such as a silicone foam or the like. During the coupling process, as the first and second shell members are moving towards the capacitors to engage and surround the capacitors, the compressible liners can reduce and/or more evenly spread, the compressive forces exerted on the capacitors. For example, the liners can compress different amounts in different places, if necessary, to make the clamp forces exerted on the capacitors more uniform. The compression of the liners during coupling may also provide an inherent benefit of self-centering of the support structure on the capacitors.

FIG. 31 illustrates a portion of one of the support structures 1004 shown in FIGS. 27 through 30 in a partially assembled state according to an embodiment. To assemble the support structure, the first and second shell members 1030, 1032 are arranged along opposite sides of the corresponding capacitors 208 and are aligned with each other to enable the rods 1050 to be received into corresponding apertures 1052. The shell members are pushed towards each other, and towards the capacitors therebetween. In an embodiment, both the first shell member and the second shell member can move relative to the capacitors. The shell members move towards each other along a coupling axis 1066. The engagement of the rods within the apertures guide the movement along the coupling axis and maintain alignment of the shell members. In the partially assembled state shown in FIG. 31, the compressive liners 1060 are just starting to engage outer surfaces 1068 of the capacitors.

FIG. 32 shows the portion of the support structure 1004 of FIG. 31 in a fully assembled state according to an embodiment. In one or more embodiments, once the distal tips 1056 of the rods 1050 protrude from the apertures along the outer side 1054 of the second shell member 1032, fasteners 1070 are coupled to the distal tips to secure the first and second shells together. The fasteners 1070 in an embodiment are nuts that are threadably coupled to the threaded rods. Providing a rotational torque on the nuts to rotate the nuts on the rods may exert a clamp force that draws the two shell members together along the coupling axis 1066 (shown in FIG. 31). The clamp force exerted by the tightening of the nuts may enable self-centering of the support structure around the capacitors. For example, if there is a larger clearance between the first shell member and the capacitors than between the second shell member and the capacitors, then the clamp force may cause the first shell member to move a greater distance towards the capacitors and the second shell member than the distance that the second shell member moves to provide self-centering. The compressive liners 1060 may spread the clamp forces to provide relatively even compressive forces around the perimeter of the capacitors.

In an embodiment, after coupling the first and second shell members together to assemble the support structure on the capacitors, the assembled support structure is then secured to the chassis 504. Optionally, the support structure can be secured to the chassis via a mounting bracket 1072 that couples the top 1020 of the support structure to the beam 1018 of the chassis (shown in FIG. 27). The support structure may be assembled prior to securing the support structure to the chassis to enable both shell members to move freely along the coupling axis during the coupling process.

Figure 33:
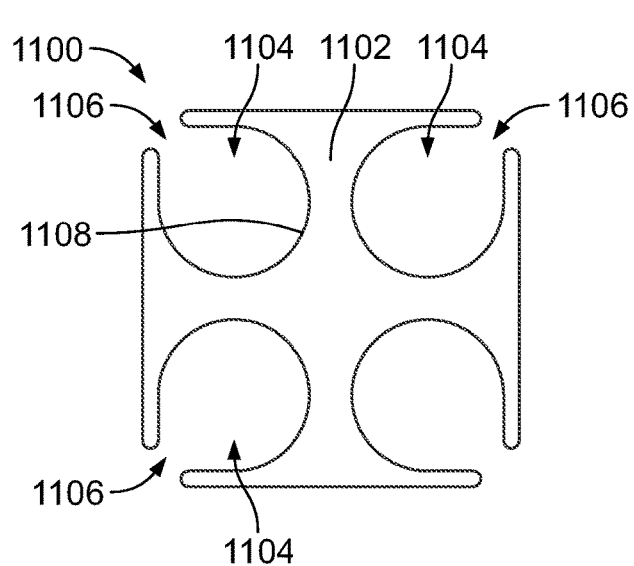
FIG. 33 illustrates a support structure for mechanically supporting multiple electrical energy storage devices of the electrical power delivery system according to a first alternative embodiment.

FIG. 33 illustrates a support structure 1100 for mechanically supporting multiple electrical energy storage devices, such as capacitors, of the electrical power delivery system according to a first alternative embodiment. Two of the support structures 1100 may be used in place of the two support structures 1004 shown in FIGS. 27 through 32. The support structure 1100 has a unitary, monolithic (e.g., one-piece) body 1102 that defines multiple openings 1104 therethrough. The openings extend fully through a thickness of the body. The openings are spaced apart along a surface area of the support structure. Each of the openings is sized and positioned to receive a single capacitor therein. In the illustrated embodiment, the support structure has four openings that are arranged in different quadrants of the support structure.

To mount the support structure on the capacitors (or other energy storage devices) that project from the bus bar, the support structure is moved in a mounting direction relative to the capacitors. The mounting direction is oriented towards the bus bar 206 along the lateral axis 1001 shown in FIG. 27, such that the distal ends 1008 are the first portions of the capacitors received through the openings of the support structure. Due to the quadrilateral arrangement of the four openings, the support structure may be mounted on an upper group of four capacitors shown in FIG. 27 or a lower group of four capacitors. Another support structure that is a replica of the illustrated structure can be mounted to the other group of four capacitors to mechanically support all eight capacitors in the array. Alternatively, the support structure 1100 could be redesigned to define eight openings sized and positioned for mechanically supporting all eight of the capacitors using the single support structure.

In the illustrated embodiment, the openings are not closed shapes (e.g., closed circles), but rather are open at the corners 1106 of the support structure. The open corners may enable the body of the support structure to at least partially deflect or flex as the support structure is loaded onto the capacitors, which may provide alignment and/or self-centering of the support structure relative to the capacitors. The support structure optionally may have compressible liners (not shown) along inner surfaces 1108 of the body that define the openings. Like the support structures 1004, the support structure 1100 can engage and at least partially surround the capacitors, and to mechanically support the capacitors along at least two support directions that are orthogonal to each other.

Figure 34:
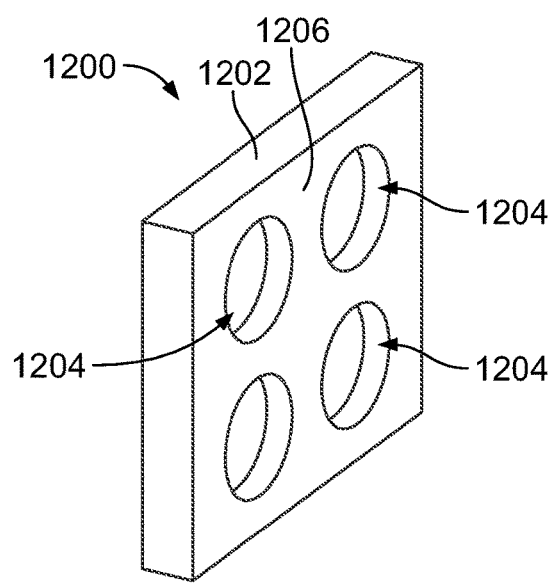
FIG. 34 illustrates a support structure for mechanically supporting multiple electrical energy storage devices of the electrical power delivery system according to a second alternative embodiment.

FIG. 34 illustrates a support structure 1200 for mechanically supporting multiple electrical energy storage devices, such as capacitors, of the electrical power delivery system according to a second alternative embodiment. In the illustrated embodiment, the support structure has a unitary, monolithic (e.g., one-piece) body 1202 that defines multiple depressions 1204 along a first side 1206 of the body. The depressions are positioned in a quadrilateral arrangement similar to the openings 1104 of the support structure 1100 shown in FIG. 33. The depressions optionally do not extend fully through a thickness of the body. Rather, the depressions resemble craters or cavities. The depressions are positioned and sized such that each depression receives the distal end 1008 (shown in FIG. 27) of a different capacitor therein as the support structure is moved in the mounting direction towards the bus bar to mount the support structure on the capacitors. The depressions cup the distal ends of the capacitors. The body of the support structure may be at least partially compressible or deflectable to dampen and/or absorb forces. For example, the body may include a compressible foam.

Like the support structure 1100, two of the support structures 1200 may be utilized to mechanically support all eight of the capacitors. Alternatively, the support structure 1200 could be redesigned to define eight depressions sized and positioned for mechanically supporting all eight of the capacitors using the single support structure. Like the support structures 1004 and 1100, the support structure 1200 can engage and at least partially surround the capacitors, and to mechanically support the capacitors along at least two support directions that are orthogonal to each other.

Figure 35:
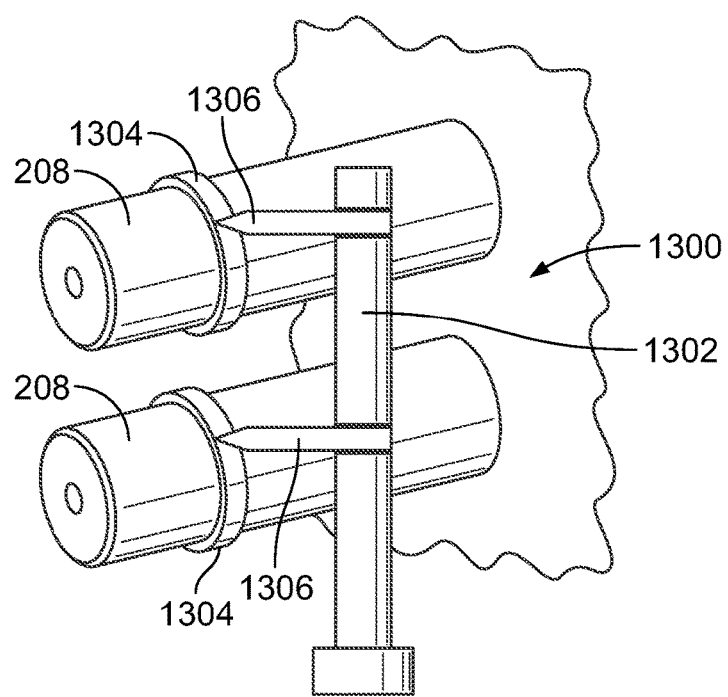
FIG. 35 illustrates a support structure for mechanically supporting multiple electrical energy storage devices of the electrical power delivery system according to a third alternative embodiment.

FIG. 35 illustrates a support structure 1300 for mechanically supporting multiple electrical energy storage devices 208, such as capacitors, of the electrical power delivery system according to a third alternative embodiment. The support structure 1300 may include a rigid body 1302 and multiple collars 1304 that are tethered to the rigid body 1302. The rigid body may be a post that is affixed to the chassis or may represent a portion of the chassis. Each collar is a band that engages and wraps around a different one of the capacitors. The collars are tethered to the rigid body via straps 1306. Like the support structures 1004, 1100, and 1200, the support structure 1300 may mechanically support the capacitors along at least two support directions that are orthogonal to each other.

In one or more embodiments, the specific type, materials, and/or dimensions of the support structure(s) used to mechanically support the electrical energy storage devices may be selected based on expected use of the electrical power delivery system. For example, if the electrical power delivery system is to be mounted onboard an off-road vehicle that experiences significant vibration and/or impact forces due to travel over uneven terrain or other operations, the type of support structure, or materials and dimensions thereof, may be selected to provide a desired amount of support to withstand such vibration and/or impacts without damaging the energy storage devices or degrading the performance thereof. In a non-limiting example, the two-piece clamshell design of the support structure 1004 shown in FIGS. 27 through 32 may provide more support than the unitary design of the support structure 1100 shown in FIG. 33. Based on this presumption, the support structure 1004 may be selected for more rugged use applications in which greater forces are expected to be exerted on the power delivery system, and the support structure 1100 may be selected for more tame use applications with lower expected forces on the power delivery system. Besides the selection of the type of support structure, the materials, dimensions, and/or mounting means of the support structure to the chassis may be customized or selected based on the harshness of the intended use. For example, the type and/or size of compressible liners within the support structure may have a selected compliancy level (or other properties) designed to absorb and dissipate the expected magnitude of forces.

In one or more embodiments, an electrical power delivery system is provided that includes a module stack, a conductive bus bar, and one or more energy storage devices. The module stack includes multiple modules stacked side by side along a stack axis. Each of the modules has a respective housing and internal electrical components within the housing. The conductive bus bar is oriented along a plane parallel to the stack axis. The bus bar is mounted along a side of the module stack and electrically connected to one or more of the modules. The one or more energy storage devices are electrically connected to the bus bar and extend from a side of the bus bar facing away from the module stack such that the bus bar is disposed between the one or more energy storage devices and the module stack.

Optionally, the internal electrical components of at least two of the modules in the module stack have a same configuration. The internal electrical components of at least one module in the module stack are different from the internal electrical components of another module in the module stack.

Optionally, the housings of the modules in the module stack have a same form factor.

Optionally, the modules of the module stack include a rectifier module between two inverter modules. The rectifier module is configured to distribute electric current to the two inverter modules via the bus bar. Optionally, the rectifier module is electrically connected to an alternator that supplies electric current to the rectifier module, and the two inverter modules are electrically connected to different corresponding motors to supply electric current for powering the motors.

Optionally, the modules in the module stack include at least one inverter module, at least one rectifier module, and at least one chopper module. Optionally, a first chopper module of the at least one chopper module is disposed at an end of the module stack.

Optionally, the internal electrical components within the housings of the modules include one or more of transistors, diodes, or inductors.

Optionally, the one or more energy storage devices include an array of capacitors mounted to the bus bar. Each of the capacitors in the array extends from the bus bar along a respective central axis. The central axes of the capacitors are parallel to one another and perpendicular to both the stack axis and the plane of the bus bar.

Optionally, the electrical power delivery system further includes a case. The module stack, the bus bar, and the one or more energy storage devices are commonly housed within the case.

Optionally, the electrical power delivery system further includes a chassis. The modules of the module stack are mounted to the chassis and supported by the chassis such that adjacent modules in the module stack are spaced apart from one another by clearance gaps.

In one or more embodiments, an electrical power delivery system is provided that includes a module stack and a bus bar. The module stack includes multiple modules stacked side by side along a stack axis. Each of the modules has a respective housing and internal electrical components within the housing. The bus bar is mounted along a side of the module stack and electrically connected to one or more of the modules. The bus bar includes a laminated assembly of multiple conductor planes. Modules of the module stack include a rectifier module between two inverter modules. The rectifier module is configured to distribute electric current to the two inverter modules via the bus bar. The internal electrical components of the rectifier module are configured to convert electric current received from a power source from an alternating current format to a direct current format. The internal electrical components of the two inverter modules are configured to convert the electric current received from the rectifier module from the direct current format to the alternating current format.

Optionally, the bus bar is oriented along a plane parallel to the stack axis.

Optionally, the housings of the modules in the module stack have a same form factor.

Optionally, the rectifier module is electrically connected to an alternator that supplies electric current to the rectifier module. The two inverter modules are electrically connected to different corresponding motors to supply electric current for powering the motors.

Optionally, the modules of the module stack also include a chopper module disposed at an end of the module stack.

Optionally, the electrical power delivery system further includes an array of capacitors mounted to the bus bar and extending from a side of the bus bar facing away from the module stack such that the bus bar is disposed between the module stack and the array of capacitors. Each of the capacitors in the array extends along a respective central axis that is perpendicular to the stack axis.

In one or more embodiments, an electrical power delivery system is provided that includes a module stack and a conductive bus bar. The module stack includes multiple modules stacked side by side along a stack axis. Each of the modules has a respective housing and internal electrical components within the housing. The housings of the modules in the module stack have a same form factor. The conductive bus bar is mounted along a side of the module stack and electrically connected to one or more of the modules. The internal electrical components of at least two of the modules in the module stack have a same configuration. The internal electrical components of at least one module in the module stack are different from the internal electrical components of another module in the module stack.

Optionally, the modules of the module stack include a rectifier module between two inverter modules. The rectifier module is configured to distribute electric current to the two inverter modules via the bus bar. Optionally, the modules of the module stack also include a chopper module disposed at an end of the module stack such that one of the two inverter modules is disposed between the rectifier module and the chopper module.

Reference is made to example embodiments of the inventive subject matter, examples of which are illustrated in the accompanying drawings. Wherever possible, the same reference numerals used throughout the drawings refer to the same or like parts. Certain embodiments of the inventive subject matter are described with respect to off-highway vehicles designed to perform an operation associated with a particular industry, such as mining, construction, farming, etc., and may include haul trucks, cranes, earth moving machines, mining machines, farming equipment, tractors, material handling equipment, earth moving equipment, etc. However, the embodiments of the inventive subject matter are also applicable for use with other vehicles, such as on-road vehicles (e.g., automobiles, tractor-trailer rigs, on-road dump trucks, etc.), rail vehicles, and marine vehicles. The embodiments of the inventive subject matter are also applicable for use with stationary, non-vehicular applications, to deliver electrical power within factories and other industrial settings.

To the extent that the figures illustrate diagrams of the functional blocks of various embodiments, the functional blocks are not necessarily indicative of the division between hardware circuitry. Thus, for example, one or more of the functional blocks (for example, processors or memories) may be implemented in a single piece of hardware (for example, a general purpose signal processor, microcontroller, random access memory, hard disk, and the like). Similarly, the programs may be stand-alone programs, may be incorporated as subroutines in an operating system, may be functions in an installed software package, and the like. The various embodiments are not limited to the arrangements and instrumentality shown in the drawings.

The description is illustrative and not restrictive. For example, the embodiments (and/or aspects thereof) may be used in combination with each other. In addition, many modifications may be made to adapt a particular situation or material to the teachings of the inventive subject matter without departing from its scope. While the dimensions and types of materials described herein define the parameters of the inventive subject matter, they are by no means limiting and are example embodiments. Many other embodiments will be apparent to one of ordinary skill in the art upon reviewing the above description. The scope of the inventive subject matter should, therefore, be determined with reference to the appended claims, along with the full scope of equivalents to which such claims are entitled.

This written description uses examples to disclose several embodiments of the inventive subject matter and also to enable one of ordinary skill in the art to practice the embodiments of inventive subject matter, including making and using any devices or systems and performing any incorporated methods. The patentable scope of the inventive subject matter is defined by the claims, and may include other examples that occur to one of ordinary skill in the art. Such other examples are within the scope of the claims if they have structural elements that do not differ from the literal language of the claims, or if they include equivalent structural elements with insubstantial differences from the literal languages of the claims.

As used herein, an element or step recited in the singular and proceeded with the word "a" or "an" should be understood as not excluding plural of said elements or steps, unless such exclusion is explicitly stated. Furthermore, references to "one embodiment" of the inventive subject matter are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112 (f), unless and until such claim limitations expressly use the phrase "means for" followed by a statement of function void of further structure.

What is claimed is:

1. A modular rack system comprising:
    a rack having plural electrical interfaces;
    plural module panels configured to mate with the electrical interfaces of the rack, wherein the module panels include connectors configured to mate with the electrical interfaces of the rack; and
    a controller configured to be conductively coupled with the rack and to control operation of internal electrical components of the module panels, wherein the controller is configured to identify the internal electrical components of each of the module panels based on a strap mode of the connectors of the module panels.

2. The modular rack system of claim 1, wherein the internal electrical component of at least one of the module panels includes a switch of an inverter and the internal electrical component of at least another of the module panels includes a diode of a rectifier.

3. The modular rack system of claim 1, wherein the rack is configured to receive and mate with one or more additional module panels to expand an operative capability of the module panels previously coupled with the rack.

4. The modular rack system of claim 1, wherein the rack is configured to swap out at least a first module panel of the module panels with a different, second module panel to change an operative capability of the module panels previously coupled with the rack.

5. The modular rack system of claim 1, further comprising heat sink interfaces coupled with the rack and shaped to thermally couple with any of the module panels.

6. The modular rack system of claim 1, the module panels having one or more of a common exterior size or a common exterior shape, at least two of the module panels having different internal electrical components configured to perform different operations.

7. The modular rack system of claim 6 wherein the rack is configured to be conductively coupled with a power delivery system of a vehicle and the module panels are configured to modify electric current prior to the electric current being supplied to the power delivery system of the vehicle.

8. The modular rack system of claim 7, wherein the internal electrical components of the module panels coupled with the rack include one or more inverters configured to convert a direct current into an alternating current for powering one or more traction motors of the vehicle, and
the rack is configured to receive one or more additional module panels having one or more inverters to convert the direct current into the alternating current for powering one or more additional traction motors of the vehicle.

9. The modular rack system of claim 8, wherein the one or more inverters comprise at least two inverters, wherein the one or more traction motors comprise at least two traction motors, wherein the one or more additional module panels comprises at least two additional module panels, and wherein the one or more additional traction motors comprise at least two traction motors.

10. A modular rack method comprising:
mating plural module panels with electrical interfaces of a rack,
conductively coupling a controller with the rack;
controlling, by the controller, operation of internal electrical components of the module panels;
mating connectors of the module panels with the electrical interfaces of the rack; and
identifying, by the controller, the internal electrical components of each of the module panels based on a strap mode of the connectors of the module panels.

11. The modular rack method of claim 10, wherein the internal electrical component of at least one of the module panels includes a switch of an inverter and the internal electrical component of at least another of the module panels includes a diode of a rectifier.

12. The modular rack method of claim 10, further comprising receiving and mating, by the rack, one or more additional module panels to expand an operative capability of the module panels previously coupled with the rack.

13. The modular rack method of claim 10, further comprising:
swapping out, from the rack, at least a first module panel of the module panels with a different, second module panel; and
changing an operative capability of the module panels previously coupled with the rack due to said swapping out.

14. The modular rack method of claim 10, further comprising:
coupling heat sink interfaces with the rack; and
thermally coupling the heat sink interface with one or more of the module panels.

15. The modular rack method of claim 10, the module panels having one or more of a common exterior size or a common exterior shape, at least two of the module panels having different internal electrical components configured to perform different operations.

16. The modular rack method of claim 15, wherein the method further comprises conductively coupling the rack with a power delivery system of a vehicle.

17. The modular rack method of claim 16, wherein the method further comprises modifying, by the module panels, electric current prior to the electric current being supplied to the power delivery system of the vehicle.

18. The modular rack method of claim 17, wherein the internal electrical components of the module panels coupled with the rack include one or more inverters configured to convert a direct current into an alternating current for powering one or more traction motors of the vehicle, and wherein the modular rack method further comprises receiving, by the rack, one or more additional module panels having one or more inverters to convert the direct current into the alternating current for powering one or more additional traction motors of the vehicle.

19. The modular rack method of claim 18, wherein the one or more inverters comprise at least two inverters, wherein the one or more traction motors comprise at least two traction motors, wherein the one or more additional module panels comprises at least two additional module panels, and wherein the one or more additional traction motors comprise at least two traction motors.

20. A vehicle comprising:
a power delivery system; and
a modular rack system including:
a rack having plural electrical interfaces; and
plural module panels configured to mate with the electrical interfaces of the rack, wherein the rack is conductively coupled with the power delivery system of the vehicle and the module panels are configured to modify electric current prior to the electric current being supplied to the power delivery system of the vehicle, wherein the module panels include connectors configured to mate with the electrical interfaces of the rack; and
a controller conductively coupled with the rack, wherein the controller is configured to control operation of internal electrical components of the module panels, wherein the controller is configured to identify the internal electrical components of each of the module panels based on a strap mode of the connectors of the module panels.

21. The vehicle of claim 20, the module panels having one or more of a common exterior size or a common exterior shape.

22. The vehicle of claim 21, at least two of the module panels having different internal electrical components configured to perform different operations.

* * * * *